United States Patent [19]

Rabe

[11] Patent Number: 4,833,347

[45] Date of Patent: May 23, 1989

[54] CHARGE DISTURBANCE RESISTANT LOGIC CIRCUITS UTILIZING TRUE AND COMPLEMENT INPUT CONTROL CIRCUITS

[75] Inventor: Robert L. Rabe, Maple Grove, Minn.

[73] Assignee: Honeywell, Inc., Minneapolis, Minn.

[21] Appl. No.: 144,664

[22] Filed: Jan. 12, 1988

Related U.S. Application Data

[63] Continuation of Ser. No. 835,018, Feb. 28, 1986, abandoned.

[51] Int. Cl.$^4$ .............................................. H03K 17/16
[52] U.S. Cl. ...................................... 307/443; 307/451
[58] Field of Search .................... 307/200 B, 443, 446, 307/448, 451, 570, 572–577, 579, 584, 585, 272 R, 272 A, 279, 291, 308

[56] References Cited

U.S. PATENT DOCUMENTS

| | | | |
|---|---|---|---|
| 3,980,897 | 9/1976 | Arnold ................................. | 307/469 |
| 4,367,420 | 1/1983 | Foss et al. ......................... | 307/468 X |
| 4,507,574 | 3/1985 | Seki et al. ......................... | 307/443 X |
| 4,518,875 | 5/1985 | Aytac ................................... | 307/473 |
| 4,569,032 | 2/1986 | Lee .................................. | 307/452 X |
| 4,570,084 | 2/1986 | Griffin et al. ........................ | 307/452 |

FOREIGN PATENT DOCUMENTS 0018018  1/1985  Japan .................................. 307/451

*Primary Examiner*—David Hudspeth
*Attorney, Agent, or Firm*—Kinney & Lange

[57] ABSTRACT

A cross-coupled load logic gate family which will keep voltage at a logic gate output below that of a switching threshold and a subsequent logic gate during a charge disturbance upset.

58 Claims, 5 Drawing Sheets

CHARGE DISTURBANCE RESISTANT LOGIC CIRCUITS UTILIZING TRUE AND COMPLEMENT INPUT CONTROL CIRCUITS

This application is a continuation of application Ser. No. 835,018, filed Feb. 28, 1986, now abandoned.

BACKGROUND OF THE INVENTION

The present invention relates to digital logic and memory circuits, and more particularly, to logic gate circuits and to latch circuits formed in a monolithic integrated circuit chip which is subject to charge generating disturbances.

Monolithic integrated circuit structural features have been shrinking rapidly in size in recent years. Along with this shrinkage, electrical currents and electrical charge accumulations formed and manipulated in integrated circuits based on these features have also been diminishing in value. As a result, charge accumulation quantities generated by certain charge generating disturbances which, in integrated circuits with larger feature sizes, would not be a problem are now quantities which are sufficiently large to cause difficulties in smaller feature integrated circuits.

In voltage level state switching circuits, such as logic circuits or memory circuits, which are constructed using such smaller integrated circuit structures, these disturbance charges can be sufficient to cause switching from an existing logic state to another at points in the circuit where such charge is generated. As an example, consider a typical inverter circuit in the complementary metal-oxide-semiconductor field-effect transistor (CMOS FET) logic circuit family implemented in a monolithic integrated circuit formed by advance, but now currently available, technology capable of providing features having a minimum lateral dimension on the order of 1.25 m. Such an inverter has a p-channel transistor drain connected to an n-channel transistor drain to form the inverter output with the gates of each connected together to form the inverter input. Assuming circuit component structural features of minimum size, the structure from the output of a preceding logic gate circuit, connected to the inverter input, through the gate structures of the inverter input could be expected to have stored in the parasitic capacitance associated therewith a quantity of charge having a value on the order of 0.5 pC.

Then, if the inverter is assumed to have a switching threshold voltage which is approximately half the inverter circuit supply voltage, any charge disturbance which is on the order of 0.25 pC is potentially sufficient to cause a change of voltage state in the inverter. In comparison, the charge which can be collected at a pn junction in the logic gate output structure subjected to impingement of an energetic heavy ion could be as much as to be on the order of 3.0 pC. Thus, a significant risk exists of an unwanted output voltage state change for such an inverter, representing an erroneous logic signal, where this inverter is fabricated using the technology now becoming available.

Typically, such disturbances are local to the region near where the disturbance is generated and are temporary; thus, such a disturbance is often termed a "single event upset." Also, though the disturbance cause may be temporary, the results of the disturbance may be stored and are subject to being propagated further in the system which may lead to longer term and more significant effects.

A typical source of such charge generating disturbances is particle radiation. Such particles impinging on a monolithic integrated circuit will have "interactions" with the semiconductor material lattice structure and electrons along the paths thereof through the integrated circuit semiconductor material. This will result in raising the energy of the electrons involved into the conduction band and leaving corresponding holes in the valance band. Should such electron-hole pairs be generated sufficiently close to a semiconductor pn junction, the electrons and holes so situated are subject to being collected by the action of electric fields in the region resulting because of voltage being supplied to such junction and because of diffusion toward such junction. The structure of transistor devices in monolithic integrated circuits, and the method of operating both such devices and the circuits using them generally, is such that only reverse-biased pn junctions need to be considered to understand the effects of a radiation particle impinging thereabout.

In FIG. 1, a semiconductor material substrate, 10, of one conductivity type is shown having in it a dopant diffusion or implantation forming a region, 11, of an opposite conductivity type. Should a radiation particle impinge on region 11 and pass on into remaining portions of substrate 10, electron-hole pairs will be generated along the track of the particle as a result of the "interactions" indicated above.

If substrate 10 is of p-type conductivity and region 11 is of n-type conductivity, a voltage applied to place region 11 positive with respect to remaining portions of substrate 10 leads to reverse-biasing the semiconductor pn junction, 12, therebetween. The electrons sufficiently energized by the radiation particle and the corresponding holes will be separated by the electric field near junction 12 with electrons being attracted to positive region 11 and holes being attracted or repelled into remaining portions of substrate 10. This separation of electrons and holes, in effect, provides a temporary current flow from region 11 into remaining portions of substrate 10.

This current will be comprised of an immediate drift current component for electrons and holes which are immediately subject to such electric fields. A further component of this current will be provided by those electrons and holes which subsequently, by diffusion, move to be within the influence of this electric field. Such a current flow would have the effect of tending to discharge region 11 and so reduce the voltage of region 11 with respect to region 10, and to discharge the parasitic capacitances unavoidably present across junction 12.

If the conductivity types of region 11 and substrate 10 were reversed, the voltage polarity would also have to be reversed to provide reverse-bias to junction 12. Upon a similar radiation particle impact, the same collection process would occur but region 11, rather than tending to be discharged by arriving electrons, would not tend to be charged by arriving holes and to increase in voltage with respect to substrate 10. However, in either situation, the charge generated by an impinging radiation particle would act in a manner to tend to reduce the reverse-bias voltage across pn junction 12.

Metal-oxide-semiconductor field-effect transistor (MOSFET) circuits using only n-channel field-effect transistors will have only regions such as 11 of solely n-type conductivity formed in a p-type conductivity substrate. In these circumstances, an impinging radiation particle will generate charge resulting in the electrons being attracted to the implanted or diffused regions serving as the sources and drains of the n-channel transistors. This charge, as stated above, tends to reduce the reverse-bias voltage on the associated pn-junction.

In those MOSFET circuits using only p-channel field-effect transistors, the implanted or diffused regions will be all p-type conductivity formed in an n-type conductivity substrate and will tend to increase in voltage as holes are attracted thereto as a result of the impingement of a radiation particle. CMOS FET requires further consideration as such circuits use both n-channel and p-channel field-effect transistors therein.

Such consideration can be given by looking further at FIG. 1 where a well region, 13, is shown formed in substrate 10 having a further dopant implanted or diffused region, 14, formed therein. Well region 13 is separated from substrate 10 by semiconductor pn junction, 15, and region 14 is separated from well region 13 by a further semiconductor pn junction, 16. If an n-well CMOS arrangement is contemplated, then well region 13 is of n-type conductivity as would region 11 be. Substrate 10 would then be of p-type conductivity as would region 14.

Regions 11 and 14 are then typical of the kinds of region used as sources and drains in constructing n-channel and p-channel field-effect transistors in an n-well CMOS integrated circuit. In such a circuit, junctions 12, 15 and 16 will all be reverse-biased in operation. This means that region 11 would be held positive with respect to substrate 10 as would region 13. Region 13 would also be held positive with respect to region 14.

A radiation particle impinging on region 11 and continuing into substrate 10 would still yield the same results as described above. That is, the electrons generated by the impinging particle would be attracted to region 11, and would be attracted from some distance into substrate 10, perhaps on the order of 7 μm in a current advanced fabrication process, and somewhat less in smaller structure fabrication processes of the future. This would again tend to discharge region 11 and to reduce the reverse-bias voltage on junction 12.

A radiation particle impinging on region 14 and continuing on through region 13 into substrate 10 would, on the other hand, lead to much less charging of region 14 by holes on a comparable basis. The holes generated in region 13 by the radiation particle would split into two categories with those sufficiently near junction 16 being attracted to region 14, but with those sufficiently near junction 15 being attracted to substrate 10. As a result, region 14 will only attract holes which are within 1 to 2 μm of junction 16 in well region 13. (This is true of current advance fabrication processes and is equal to approximately one half the distance separating junctions 15 and 16.) Further, the lower mobility of holes in well region 13 will also diminish the number of them which are attracted to region 14.

As a result, for n-well CMOS monolithic integrated circuits, the charging of p-type conductivity sources and drains will be relatively insignificant. Instead, the discharging of the n-type conductivity sources and drains of the n-channel field-effect transistors will be most signficant in causing voltage changes sufficient to upset circuit operation. The p-type conductivity sources and drains of the p-channel field-effect transistors will attract charge from such a particle impinging therein which, in quantity, will typically be in order of magnitude less than the charge attracted by the n-type conductivity sources and drains. Thus, any voltage changes on such p-type conductivity sources and drains (because of this attracted charge) will be smaller also by an order of magnitude. The p-well CMOS integrated circuits, on the other hand, the charge attracted to the p-type conductivity sources and drains resulting from an impinging radiation particle will be more dominant compared to the charge attracted to the n-type conductivity sources and drains.

Returning to the earlier example of the common CMOS circuit inverter, consider this inverter having connected to its input a NAND or NOR logic gate of the basic configuration commonly used in CMOS circuits, both of which are fabricated in an n-well fabrication process. If such a logic gate has its single output terminating region which is in a high voltage level state, one or more of the p-channel transistors in the gate connected to the output will be switched into the "on" or conducting condition while one or more of the n-channel transistors connected to the output will be switched into the "off" or nonconducting condition.

In this circumstance, the power supply voltage is essentially applied as a reverse-bias voltage across the drain or drains of these off n-channel transistors. The impingement of a radiation particle in one of these n-channel transistor drain regions would generate a charge perhaps on the order of 3.0 pC, as earlier indicated, which would tend to reduce the reverse bias on the drain junction. Thus, this charge accumulated in the drain region would temporarily but drastically lower the voltage at the output of the logic gate and so the voltage applied to the input of the inverter. A similar result would follow if another such NAND or NOR logic gate was substituted for the inverter.

There is nothing which would prevent such a change at the input of the inverter from changing the output state of the inverter to the opposite state. This could similarly be true of the logic gate depending on the values taken by other input variables. Such an erroneous logic state change could then propagate along the subsequent logic circuits connected to the output of either such inverter or such a logic gate. This, of course, assumes that the inverter, or the logic gate is used instead, and the subsequent logic circuits could respond sufficiently fast to the rapidity of the voltage state change, and that the configuration of the subsequent logic circuits and the state of the other logical variables applied thereto would not serve to block such a propagation.

Clearly, however, in many instances such a propagation would not be blocked with the consequence of erroneous system operation. Further, such a change could occur in one of a pair of cross-coupled inverters serving as a data latch leading to incorrect data being stored in the system. Such data could affect a number of future system operations possibly causing some of them to provide erroneous system results.

Therefore, logic gates circuit arrangements which would lead to logic systems that avoid the undesirable consequences of charge generating disturbances, such as by radiation particle impingement, would be desirable. Also desirable would be the provision of latch circuits or other data storing circuits which would be unaffected by such charge generating disturbances.

SUMMARY OF THE INVENTION

The present invention provides logic gates having cross-coupled switching devices controlled by input arrangements having distinct, complementary portions connected to the cross-coupled devices control regions to provide the logic gate outputs. The input arrangement can be structured to pass current from the cross-coupled devices during a charge disturbance upset which will keep voltage at a logic gate output below that of the switching threshold in a subsequent logic gate connected to such output. Arrangements of these logic gates can be provided which will limit the propagation of any erroneous states occurring as a result of a charge disturbance whether in a logic state chain or in a data storage latch.

DESCRIPTION OF THE PREFERRED EMBODIMENTS

Figure 1:
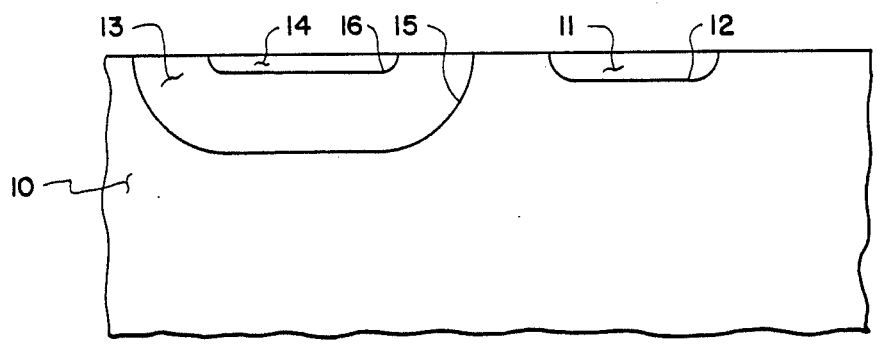
FIG. 1 shows a diagram of some varying conductivity type regions in semiconductor material leading to the occurrence of some semiconductor pn junctions.

The logic state circuit arrangements to be described hereinafter can be implemented in various circuit technologies and in various monolithic integrated circuit technologies as will be described to some extent in the following. However, the primary description following will be based on CMOS field-effect transistor circuits formed in a monolithic integrated circuit using an n-well structural arrangement in a p-type conductivity substrate. Each enhancement mode, n-channel insulated gate field-effect transistor (IGFET), e.g. a silicon gate MOSFET, is formed as a switching device directly in this substrate. Each enhancement mode, p-channel IGFET, e.g. a silicon gate MOSFET, is formed as a switching device in an n-conductivity type region, the well or tub, which is earlier formed in the p-type conductivity substrate. In such an arrangement, each substrate connection for each n-channel MOSFET is made to the p-type conductivity substrate and this substrate is typically connected to the most negative supply voltage in the circuit, usually ground. Each of the p-channel MOSFET substrate connections is made to the n-type conductivity well or tub in which it is formed, which wells in turn are each, typically, all electrically connected to the most positive supply voltage in the circuit, typically 5.0 volts. Such substrate connections will not always be shown in the accompanying drawing figures to minimize schematic diagram complexity.

The n-channel MOSFETs in the circuit typically have a common channel length so that they perform similarly to one another over fabrication process and operating temperature variations, and so typically do the p-channel MOSFETS. After fabrication, these n-channel and p-channel MOSFETS will all have approximately the same effective channel length even though they are designed with different channel lengths initially, the difference compensating for somewhat different results in the fabrication process for the two kinds of transistors. Thus, differences in the desired "on" condition resistance for these transistors, determined essentially by channel length-to-width ratios, will be provided through selecting different channel widths for different transistors. Alternatively, a series combination of the same kinds of transistors can be provided to achieve, in effect, a longer channel length.

Also, steps taken in the fabrication process to set the value of the threshold voltage for both the n-channel and p-channel MOSFETS results in both kinds of transistors having a zero source-substrate voltage different threshold voltage of approximately the same magnitude, but of opposite sign as the nature of these two kinds of transistors requires. The zero source-substrate voltage difference threshold voltage value for the n-channel MOSFETs in the description here is approximately 0.8 volts, and for the p-channel transistors it is approximately −0.8 volts. Variations of the threshold voltage due to fabrication process variations lead to similar changes in value and in a common direction for both n-channel and p-channel MOSFETS. However, changes in threshold voltage due to temperature affect the magnitude only of the threshold voltage of each kind of transistor.

Figure 2:
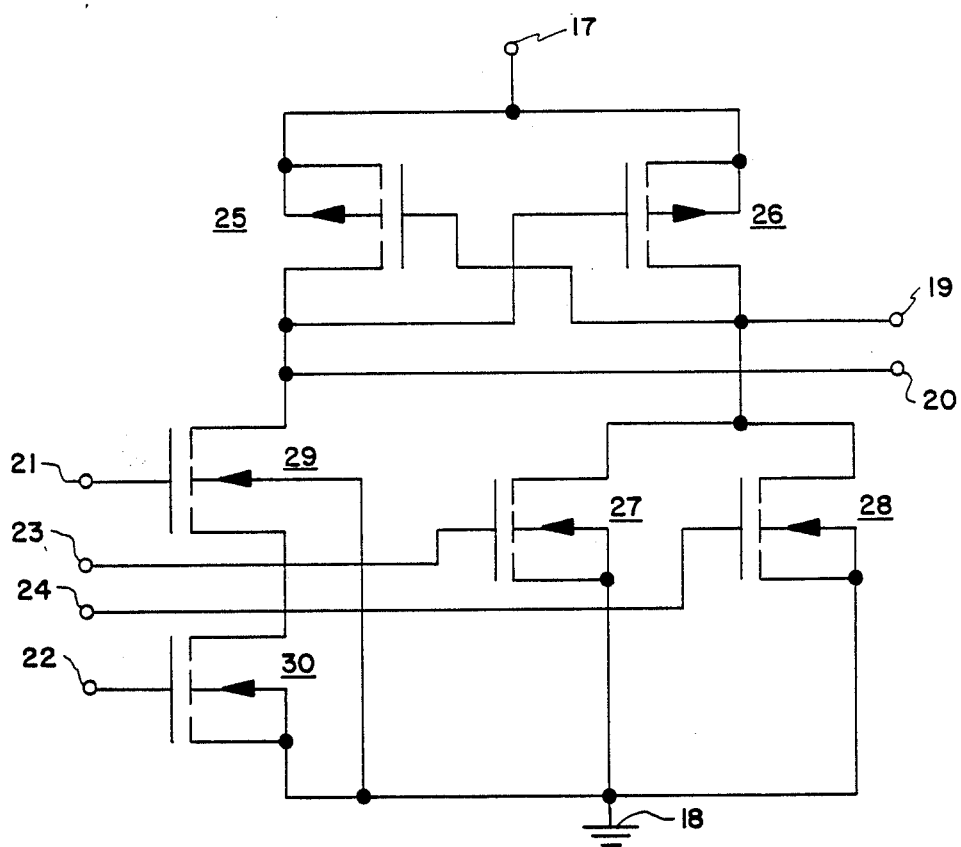
FIGS. 2 through 9 show schematic diagrams of various embodiments of the present invention.

FIG. 2 is a schematic circuit diagram of a typical logic gate circuit of a kind which can prevent the propagation of logic state errors due to charge generating disturbances occurring about or in some of its components in its implementation in a monolithic integrated circuit. The logic gate of FIG. 2 has a terminating region, 17, suitable for connection to a relatively positive supply of voltage, and a further terminating region, 18, suitable for connection to a relatively negative supply of voltage here marked as being ground. The logic gate has two outputs, 19 and 20, at which complementary voltage level logic state output signals are expected to occur. There are also four signal inputs, 21, 22, 23 and 24, at which two pairs of complementary voltage level logic states are normally to be provided.

The logic gate has a pair of cross-coupled p-channel MOSFETs, 25 and 26, with those terminating regions of these transistors serving as drains being connected to logic gate terminating region 17. The gate controlling transistor 25 is connected to the other terminating region of transistor 26 serving as a source thereof to provide output 19. Similarly, the gate controlling transistor 26 is connected to the other terminating region of transistor 25 serving as a source thereof to form output 20. Together transistors 25 and 26 form a plural state circuit portion providing complementary voltage level states at gate outputs 19 and 20.

Also connected to output 19 are the terminating regions serving as drains of two n-channel MOSFETs transistors, 27 and 28. The terminating region serving as sources of transistors 27 and 28 are each connected to logic gate terminating region 18. The gates which control transistor 27 and 28 form logic gate inputs 23 and 24, respectively. Transistors 27 and 28 form a control circuit portion for controlling transistors 25 and 26 at output 19.

Finally, a control circuit portion to control transistors 25 and 26 at output 20 is formed of two further n-channel MOSFETs, 29 and 30. The terminating region of transistor 29 serving as its drain is connected to output 20. The other terminating region of transistor 29 serving as the source thereof is connected to the terminating region of transistor 30 serving as its drain. The other terminating region of transistor 30 serving as its source is connected to logic gate terminating region 18. The gates controlling transistors 29 and 30 serve as logic gate inputs 21 and 22, respectively.

The plural state circuit portion transistors 25 through 30 are each switching devices interconnected in a regenerative cross-coupled arrangement so that normally one is in the "on" condition having a low impedance or effective resistance between its source and drain, and the other is in the "off" condition having a high impedance or effective resistance between its source and drain. These transistors can be caused to each switch to the opposite condition by the control circuit portions connected to each output. This is accomplished by having the control circuit portion connected to the output in a high voltage state level establishing a circuit path of relatively low impedance therethrough in response to logic gate input signals with the other establishing only relatively high impedance paths therethrough concurrently in response to logic gate input signals. Note that the substrate connection for each of the transistors in FIG. 2 is shown explicitly in that figure.

The logic gate of FIG. 2, with one definition of the logic signal variables applied to inputs 21 through 24, will behave as a two input NAND gate at output 19 and as a two input AND gate at output 20—each the complement of the other. For this definition, the input logic signals as Boolean algebra variables are defined to have one input variable applied at input 21 and the other variable applied at input 22. The complement forms of these variables are applied at inputs 23 and 24, respectively. To make description clearer, assign the Boolean variables $x_1$ to input 21 and its complement $x'_1$ to input 23, and assign the Boolean variable $x_2$ to input 22 and its complement $x'_2$ to input 24. A prime mark after a Boolean variable means the complement of the variable.

Positive logic is assumed in the following operation description so that relatively positive voltage level state, i.e. a high voltage level state, represents the Boolean algebra element 1 and a relatively negative voltage level state, i.e. a low voltage level state, represents the Boolean element 0. High voltage states, for positive logic, are ones of sufficiently large voltage, if applied at a logic gate input, to be capable of having a voltage state change on the output of that logic gate if other inputs permit it to do so. A low voltage state is one of sufficiently small voltage to be unable to cause such a change even if the other inputs were such as to permit it to do so.

The description of the operation of the logic gate circuit of FIG. 2 with this input definition can be begun by assuming that $x_1$ and $x_2$ are each 0 so that a relatively negative voltage, i.e. a low voltage state, is applied to inputs 21 and 22. Then transistors 29 and 30 will be in the "off" condition and transistors 27 and 28 will be in the "on" condition. This follows because $x'_1$ and $x'_2$, being complements, must have a value of 1, i.e. in the relatively positive or high voltage state. In these circumstances, transistor 25 will be in the "on" condition as its gate will be essentially grounded by the low impedance circuit path established through transistors 27 and 28. Transistor 26, on the other hand, will be in the "off" condition since its gate will be nearly at the positive supply voltage on logic gate terminating region 17 through transistor 25 since there is only a high impedance circuit path through transistors 29 and 30.

Changing either $x_1$ or $x_2$ to 1 will switch either transistor 29 or transistor 30 into the "on" condition, and accordingly switch either transistor 27 or transistor 28 into the "off" condition as the corresponding complementary variable takes its opposite value. This will have no effect on the status of voltages at outputs 19 and 20. This follows because there will be no low resistance path established by such an input signal change between output 20 and terminating region 18 while there will still remain at least one low impedance path between output 19 and terminating region 18.

Only upon both $x_1$ and $x_2$ on inputs 21 and 22 taking a 1 value will there be a low impedance path established between output 20 and terminating region 18 through transistors 29 and 30 as they both switch into the "on" condition. Concurrently, both transistors 27 and 28 will switch into the "off" condition leaving only a high impedance path between output 19 and gate terminating region 18.

In the transition of $x_1$ and $x_2$ from 0 to 1, the voltage will rise on inputs 21 and 22 and a sufficiently low impedance circuit path will be established through transistors 29 and 30 to begin to discharge the parasitic capacitance associated with output 20 while at the same time beginning to sink some of the current capable of being supplied by transistor 25 in the "on" condition. When established at a sufficiently low impedance value, this circuit path will thereby reduce the voltage at output 20 to a sufficiently low value to begin switching transistor 26 into the "on" condition which tends to then supply current to transistors 27 and 28, tending to raise the voltage thereacross, and so begins switching transistor 25 into the "off" condition. Concurrently, in the transition of $x'_1$ and $x'_2$ from 1 to 0, transistors 27 and 28 begin to switch into the "off" condition increasing the effective impedance therethrough and reducing the amount of current capable of being supplied by transistor 25 which can be passed by these transistors. This also tends to raise the voltage thereacross again contributing to switching transistor 25 into the "off" condition. Thus, the voltage on outputs 19 and 20 will be driven towards the opposite voltage level states by the actions of the control circuit portions in response to the input signal changes reinforcing such change at each output through the regenerative action of cross-coupled transistors 25 and 26 leading to a rapid switching of output states.

The voltage value during the transition of $x_1$ and $x_2$ from low voltage state to high voltage state at which this begins to occur, that is, the threshold value, depends on the length-to-width ratios of transistors 29 and 30 compared to that of transistor 25, and of transistors 27 and 28 compared to transistor 26, as these ratios determine the effective impedance encountered between the drains and sources of these transistors. Such impedances in relation to one another essentially determine the values of these changing current flows and voltage drops. Thus, the control circuit portions at each gate output in conjunction with the plural state circuit portion have a threshold value, or small range of values, associated with them for transitions in each direction of output voltage state changes which, if gone beyond by increasing and decreasing input signal magnitudes, leads to the outputs 19 and 20 switching to opposite voltage states.

This operation of output 20 taking a low voltage value state only if input signals applied to inputs 21 and 22 are both in a high voltage state and input signals applied to inputs 23 and 24 are both in a low voltage state corresponds to the operation of a NAND logic gate for the Boolean variables $x_1$ and $x_2$. That is, output 20 can be characterized by Boolean expression $(x_1 x_2)'$. Since output 19 must be in the opposite state because of the operation of the cross-coupled transistor plural state circuit and the complementary operation of the control circuits connected at each output, the operation of output 19 can be characterized by the Boolean expression $x_1x_2$, i.e. operation at output 19 appears to follow an AND logic function.

If the Boolean variables on the inputs were interchanged with their complements so that $x'_1$ was on input 21, $x'_2$ was on input 22, $x_1$ was on input 23, and $x_2$ was on input 24, the logic gate of FIG. 2 will perform as a 2 input NOR gate at output 19 and as an OR gate at output 20. This can be seen by repeating the description just given interchanging the variables.

Beyond this, however, the general concept illustrated in FIG. 2 can be extended to give a logic gate which provides any logic function of any reasonable number of input variables. This follows because either control circuit portion in FIG. 2 can have substituted therefor any reasonable network of n-channel transistors between the one of the logic gate outputs to which it is connected and logic gate terminating region 18 to thereby have a logic gate output operate in response to logic gate input signals in accord with any desired Boolean expression. The only condition to be met, other than practical design requirements, is that another corresponding combination of n-channel transistors be placed between the other output and logic gate terminating region 18 that will provide operation in accord with the Boolean expression complementary to the first. That is, for any set of input signals and logic state values, one control circuit portion must provide a low impedance path thereacross between the logic gate output to which it is connected and terminating region 18, while the other must concurrently provide only relatively high impedance circuit paths between the logic gate output to which it is connected and terminating region 18. There are many well known design methodologies for constructing n-channel MOSFET networks to provide a means of implementing an n-channel MOSFET logic system operating in accord with any arbitrary Boolean expression and so there is no need to review such methodologies here.

Figure 3:
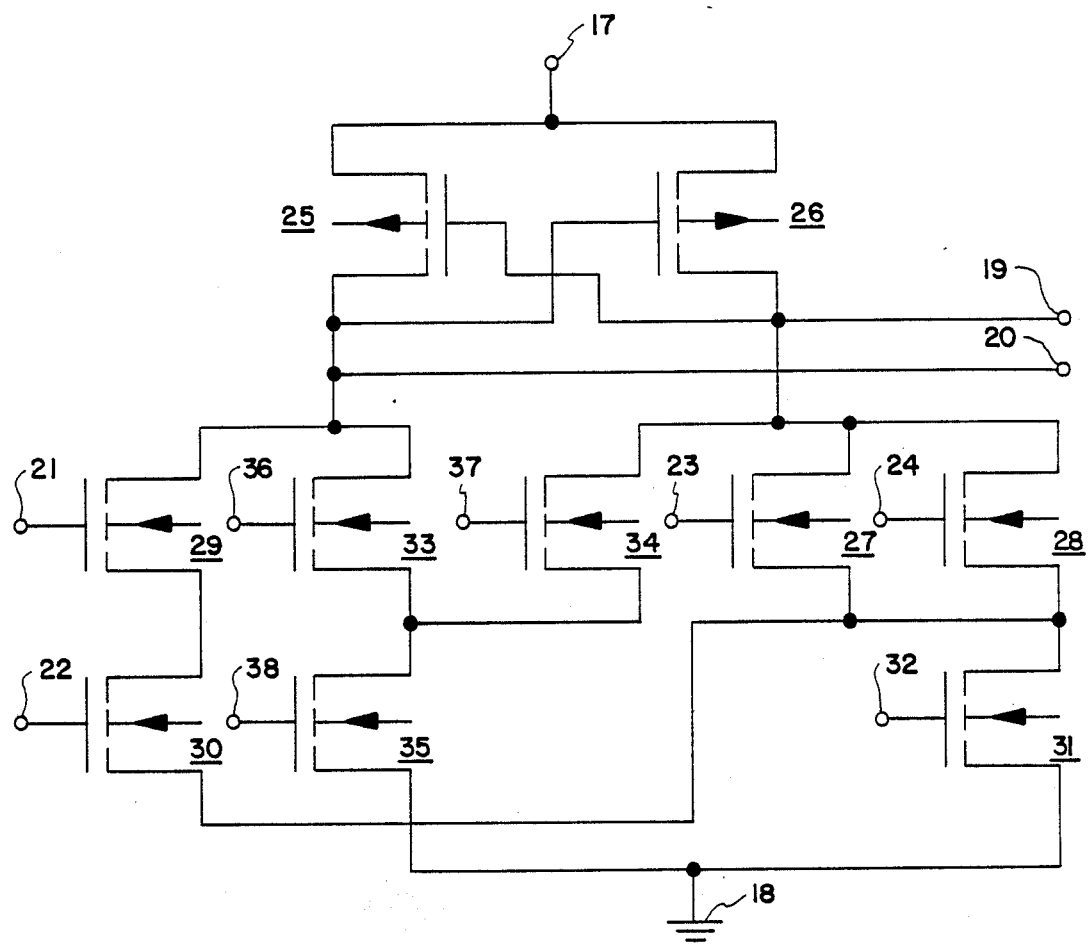

A further example of the kind of logic gates being considered here is shown in the schematic diagram of FIG. 3 which shows control circuit portions providing operation in accord with a bit more complicated Boolean expression. The gate diagrammed in FIG. 3 also shows use of a common circuit portion to enable or to not enable distinct portions of the control circuit portions to affect the logic gate output voltage states, these distinct control circuit portions each being connected to a logic gate output and to common circuit portion termination regions and each being independent of one another except through the cross-coupled transistor plural state circuit portion or the common circuit portion. Circuit components and structures in FIG. 3 serving approximately the same purpose they served in FIG. 2 have been marked with the same numbers in FIG. 3 as they were in FIG. 2. The substrate connections for the various transistors in the diagram of FIG. 3 have not been shown in that diagram.

The circuit additions in FIG. 3 include breaking the connection between gate terminating region 18, or ground, and the sources of transistors 30, 27 and 28 and instead connecting these sources to the drain of a further n-channel MOSFET, 31. The source of transistor 31 is then connected to gate terminating region 18, and the gate electrode of transistor 31 forms another logic gate input, 32. Also, output 20 has the drain of another n-channel MOSFET, 33, connected thereto and output 19 has the drain of another n-channel MOSFET, 34, connected thereto. The sources of transistors 33 and 34 are connected together and to the drain of a further n-channel MOSFET, 35. The gates of each of these transistors provide further logic gate inputs, the gate of transistor 33 providing a logic gate input, 36, the gate of transistor 34 providing a logic gate input, 37, and the gate of transistor 35 providing a final logic gate input, 38.

The addition of transistor 31 in the schematic diagram of FIG. 3 between the sources of transistors 30, 27 and 28 and gate terminating region 18 permits, under control of the input logic signal on input 32, the enabling and disenabling of the pair of complementary logic functions provided for the circuit of FIG. 2 by transistors 30, 27 and 28 there. Taking the signal on logic gate input 32 as a Boolean variable, and having the complement of that variable applied to logic gate input 38, permits having the complementary pair of logic functions implemented by the distinct control system portions extending between the drain of transistor 35 and each of outputs 19 and 20 as a substitute for the logic functions at these outputs when the FIG. 2 logic functions are disenabled.

In FIG. 3, the distinct portions of the two control circuit portions to provide this operation for the substitute Boolean expression are just transistors 33, having its drain connected to output 20 and its source connected to the drain of transistor 35, and transistor 34 having its drain connected to output 19 and its source connected to the drain of transistor 35. These simple distinct portions of the control circuit portions provide operation at the logic gate outputs in accord with Boolean inversion if an input signal as a Boolean variable is applied to logic gate input 36 and its complement applied to logic gate input 37. Of course, considerably more complex circuit arrangements of n-channel transistors operating in accord with a more complex Boolean expression could be substituted in place of transistor 33, with another n-channel transistor circuit complex substituted in place of transistor 34 operated in accord with the complementary Boolean expression.

The Boolean expression followed at each of the outputs 19 and 20 in the circuit diagram of FIG. 3 can be set out if the inputs 21 through 24 are assigned the same Boolean variables and complements as they were in connection with the schematic diagram of FIG. 2 and positive logic is assumed. Further, the variable $x_3$ must be assigned to the logic gate input 36 and its complement, $x'_3$, assigned to the logic gate input 37. The logic variable $x_4$ and its complement could be assigned to the remaining logic gate inputs, but since the preceding discussion indicated that these two transistors can in effect substitute different logic functions at outputs 19 and 20 the variables will be designated ENAB and ENAB'. The Boolean expression followed at output 20 will then be $(x_1x_2\text{ENAB}) + (x_3\text{ENAB}')$. The expression that will be followed at output 19 will then be $(x'_1+x'_2)\text{ENAB} + x'_3\text{ENAB}'$ which can be shown to be the complement of the immediately preceding expression. Note that if ENAB takes the value of 1, these expressions reduce to those found in connection with FIG. 2. If ENAB is 0, the outputs follow the expressions $x_3$ and $x'_3$.

Thus, as the examples of FIGS. 2 and 3 show, logic gates of this nature having cross-coupled switching devices forming a plural state circuit portion, formed using cross-coupled switching devices, which serves as a load, to two control circuit portions at the outputs of the plural state circuit, and perhaps with some common control circuit portions connected to distinct portions of each control circuit portion, can form very flexible logic gate arrangements in being able to provide operation corresponding to any arbitrary Boolean algebra expression. However, a further major value of such logic gates is the ability they have to prevent charge generating disturbances from propagating in a logic system comprising such gates. This prevention or limitation of propagation comes about because of the use of complementary input signals and complementary output signals, and the use of distinct control circuit portions where one of which provides a low resistance path thereacross while the other provides only high resistance path thereacross.

Charge generating disturbances, typically because of an impinging radiation particle, lead to the accumulation of electrons in an n-type conductivity region adjacent to a reverse-biased semiconductor pn junction, as earlier indicated. In CMOS field-effect transistor circuits using an n-well structure, this sequence is the predominant upset mode. In an n-channel MOSFET which is in the "off" condition, so that its drain-substrate junction is reversed biased, an impinging radiation particle on such drain region could cause the drain region to accumulate electrons and discharge to a lower voltage level state without any signal input on the transistor gate directing the transistor drain to do so. Also, although somewhat less likely, an impinging radiation particle on the drain region of a reversed p-channel MOSFET will cause that drain region to be positively charged by holes accumulating therein. This would lead to having a p-channel transistor drain in the "off" condition (so that its drain-substrate junction is reverse biased) to be raised to the high voltage level state despite no signal on the gate of the transistor directing the drain to do so.

Such radiation particle impingement on drains, or other charge generating disturbances adjacent drains, of the n-channel and the p-channel MOSFET transistors used in logic gate circuits are sources of errors in MOSFET based logic gates suffering such disturbances. Determining a logic system's behavior in the face of such disturbances bring the questions of whether such errors persist in the logic arrangement, and whether they are propagated by the logic arrangement. The following will show they do not in logic system arrangements based on the kinds of logic gates being considered here.

Figure 4:
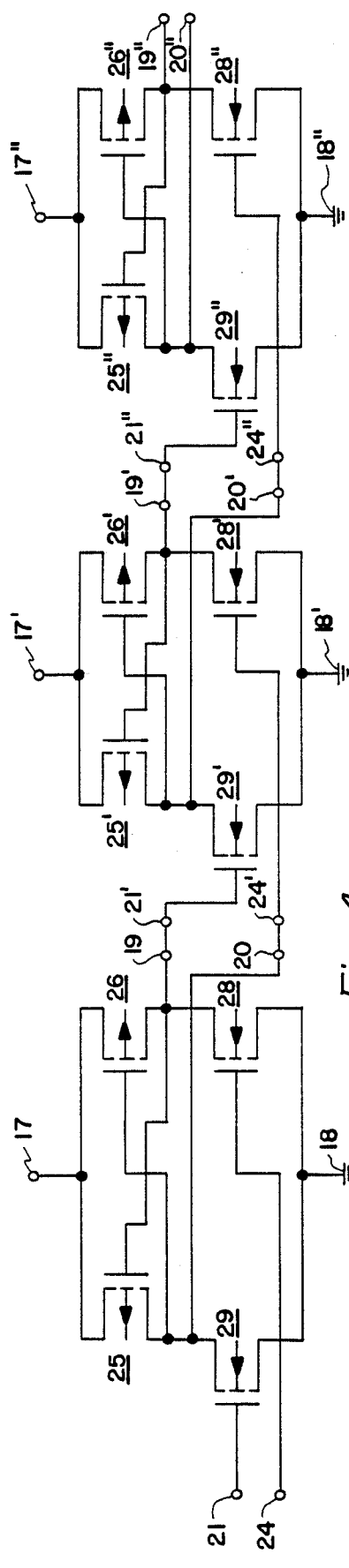

To show this is true, consider the cascade of three successive logic gates shown in FIG. 4 of the kind being described here. To simplify the description, each of the logic gates is shown to have only one transistor in each control circuit portion between each output of the corresponding cross-coupled transistor plural state circuit portion and ground. Thus, each logic gate shown is just an inverter. However, for whatever n-channel transistor arrangement that is provided between the outputs of the logic gate of this kind, there will always be one control circuit portion having a low impedance circuit path therethrough leaving the logic gate output to which it is connected in a low voltage state. The other control circuit portion will not have low impedance paths therethrough leaving the logic gate output to which it is connected in the high voltage state, both of these control circuit portion and output conditions being true absent any charge disturbances at transistor drains.

Thus, the one of the cross-coupled p-channel transistors having its drain connected to the output having a low voltage state will be in the "off" condition and subject to having its drain charged by an impinging radiation particle. Also, there will always be at least one n-channel transistor connected to the logic gate output in the high voltage state which is in the "off" condition and subject to having its drain discharged by an impinging radiation particle. Hence, the analysis of FIG. 4 based on the simple inverter circuit shown there is entirely general in that it represents, in essence, the situation for any logic gate of the kind being described.

The initial logic gate on the left in FIG. 4 has its components and structure described by the same numerical designators as comparable components and structures were in FIGS. 2 and 3. This is also true of the subsequent logic gate next on the right in FIG. 4, i.e. in the middle, except that a prime symbol has been added after each such number. Again, this is true of the gate that is a sequel to this second gate, or final logic gate in the cascade which is on the far right, except that each numerical designator for this gate has a double prime symbol added thereto.

Consider now that the input logic signals provided to inputs 21 and 24 which are to be complementary, that is, one is to be in the high voltage level state while the other is to be in a low voltage level state. Assume that for some reason the preceding signal source suffers some sort of disturbance leading to whichever of these input logic signals that has been in a high voltage state now being forced temporarily into a low voltage state. There will then be a low voltage state occurring on each of inputs 21 and 24 for some period of time.

However, such an erroneous occurrence at the inputs of this initial logic gate will have no effect on the voltage states occurring at outputs 19 and 20 of this logic gate. This is because each of the control circuit portions between each of the gate outputs 19 and 20 and ground will have only high impedance circuit paths therethrough, that is, each of transistors 28 and 29 will switch into the "off" condition. Since in this condition the transistor cannot discharge the parasitic capacitances associated with the gate outputs, the voltage on these outputs will not change.

This result would also be true for use of a more complex circuit arrangement for the control circuit portions because a low voltage state signal applied to an input can have only the effect of either (i) causing no change in any control circuit n-channel MOSFET arrangement, or (ii) eliminating any existing low impedance circuit path through the corresponding control circuit portion thereby converting it to a high resistance path. The elimination of any low resistance paths in either control circuit portion during a temporary charge disturbance cannot affect the voltage states on outputs 19 or 20 because the charged parasitic capacitances associated these outputs have no circuit path by which they can discharge and thus will hold these outputs at the same voltage levels.

Such charge disturbances are usually quite short, and in the case of an impinging radiation particle the duration of the charge accumulation event is many orders of magnitude shorter than the time constants inherent in MOSFET integrated circuit technologies. Thus, logic gates of the kind being described will not propagate beyond any such logic gate an error occurring in an input signal thereto causing such input signal to change from a high voltage state to a low voltage state.

The description of the situation where both inputs 21 and 24 are driven into a high voltage state by the occurrence of an erroneous logic input signal will be postponed until after the following description of events occurring due to charge disturbances directly affecting outputs 19 and 20 of the initial logic gate shown in FIG. 4. Because of the regenerative action described above in the cross-coupled transistor plural state circuit portion of the kind of logic gates being described here, a charge generating disturbance at one output can affect the other output of the same gate. There will, however, be no effect on inputs 21 or 24 by any disturbances occurring at outputs 19 or 20 as any effects occurring at transistor drains are not reflected into the gates of such transistors in any significant manner.

If the initial logic gate on the left hand side of FIG. 4 again has one of its inputs at a high voltage level state, say input 21, and the other at a low voltage value state, transistors 29 and 26 will be in the "on" condition while transistors 28 and 25 will be in the "off" condition. (The following description would be accurate even if the states of inputs 21 and 24 were reversed if each reference to a transistor was taken as one to the transistor horizontally across from it because of the symmetry of the circuit structure.) This means that output 19 is in a high voltage level state while output 20 is in a low voltage level logic state.

A radiation particle of sufficient energy impinging on the drain of n-channel transistor 28 in the "off" condition will result in that drain being temporarily brought to approximately ground voltage potential by accumulating electrons therein even though transistor 26 is "on". This results in the gate of transistor 25 also being brought to near ground voltage potential and, therefore, transistor 25 will switch from the "off" into the "on" condition. Transistor 25 will then pass current supplied through terminating region 17 to transistor 29, already in the "on" condition, and will attempt to charge the parasitic capacitance associated with output 20. Both of these actions resulting from switching transistor 25 "on" will act to raise the voltage on output 20 toward the high voltage state.

Should output 20 rise in voltage toward the high voltage state sufficiently to exceed the switching threshold of the subsequent logic gate at input 24' in the middle of the cascade of gates of FIG. 4, inputs 21' and 24' would receive signals reflecting the post-disturbance output voltage states occurring at outputs 19 and 20 of the initial logic gate which are just opposite the output voltage states being commanded by the signals at the inputs 21 and 24 of the initial logic gate. Since these post-disturbance signals at outputs 19 and 20 are complementary, they would appear to the subsequent logic gate to be valid signals.

Thus, if the voltage is permitted to rise sufficiently on output 20 of the initial logic gate as a result of a charge generating disturbance acting to reduce the voltage on output 19, an error will be propagated down the logic chain shown in FIG. 4. However, since transistor 29 is in the "on" condition because of the input signal appearing on input 21, a rise in voltage on output 20 of the initial logic gate can be prevented if transistor 29 can pass all of the current being supplied by transistor 25 as a result of its being erroneously switched in to the "on" condition.

Hence, there is a means to prevent error propagation from such a charge generating disturbance in the kind of logic gates being described here such as the gate examples shown in FIGS. 2 and 3. The means is meeting the condition that the control circuit portion between a logic gate output, with a cross-coupled transistor plural state circuit portion, also conencted thereto, and terminating region 18 must be designed such that any low impedance paths which can be established therethrough in response to input signals applied thereto have an effective impedance which is significantly lower than the impedance effectively occurring between the source and drain of either of the cross-coupled switching devices in the plural state circuit portion after such a device is switched "on". The impedance of a low impedance circuit path must be sufficiently lower than the drain-to-source impedance of such a switching device so that whatever current can be passed by this device supplied through a terminating region of the plural state circuit portion can be passed along such circuit path without raising the voltage thereacross above the threshold of the logic gate having an input connected to the logic gate output from which the low impedance path is established.

In the case of the initial logic gate shown on the left in FIG. 4, this means that the length-to-width ratio of transistor 29 must be sufficiently less than the length-to-width ratio of transistor 25 to meet the foregoing condition considering the threshold of the subsequent logic gate at input 24'. Similarly, the length-to-width ratio of transistor 28 should be designed to be sufficiently less than the length-to-width ratio of transistor 26. These ratios should be arranged so that the maximum current which can be supplied by either transistors 25 or 26 in the "on" condition can be passed to terminating region 18 or ground by transistors 29 and 28, respectively, without raising the voltage at either of outputs 20 or 19 past the thresholds associated with inputs 24' or 21' of the subsequent logic gate.

If this condition is met, then a charge generating disturbance at the drain of transistor 28 sending the voltage at output 19 to approximately ground will result in both outputs 19 and 20 of the initial logic gate both being in the low voltage state. As described earlier for the initial logic gate, having both inputs of the subsequent logic gate at the low voltage state does not result in propagating the error leading to such an input condition past the subsequent logic gate. Thus, if the control circuit portions between the output and the relatively negative voltage terminating region of each of the logic gates in FIG. 4 meets this criteria, with respect to the cross-coupled transistors in the plural state circuit portion, a charge disturbance event occurring at the drain of any of the n-channel MOSFETS connected to the high voltage state output of any gate will not propagate past the succeeding gate.

Consider again the initial logic gate in FIG. 4 having input 21 at a high voltage level state and input 24 at a lower level voltage state. Again, transistors 29 and 26 are "on" while transistors 28 and 25 are "off" leaving output 19 in a high voltage state and output 20 in a low voltage state. Consider this time, however, the charge generating disturbance occurs at the drain of transistor 25. That is, assume a radiation particle impinges on the drain of p-channel transistor 25 charging it positively because of accumulating holes therein and the parasitic capacitance associated with output 20 to thereby raise the voltage on output 20 to a high voltage level state, i.e. to nearly the relatively positive voltage occurring on terminating region 17. For a sufficiently large charge generating disturbance, this could occur temporarily even though transistor 29 is in the "on" condition. As a result, the gate of transistor 26 is raised to this high voltage state resulting in transistor 26 switching from the "on" condition to the "off" condition. However, with transistor 28 also in the "off" condition because of the input signal or input 24, output 19 will not have the parasitic capacitance associated therewith either charged or discharged and so will remain in its pre-disturbance high voltage state. Thus, both outputs 19 and 20 of the initial logic gate would be in the high voltage state which is a result contrary to what the input signals on initial gate inputs 21 and 24 are directing the initial logic gate to provide as output signals.

Since output 19 was already in the high voltage state, no change will occur in the control circuit portion of the subsequent logic gate connected thereto. The most this high voltage state could do in any subsequent gate control circuit portion having an input connected to output 19 is to cause an n-channel MOSFET therein to be in the "on" condition. This situation may or may not, depending on the nature of the subsequent gate control circuit portion having an input connected to output 19 and on the nature of its other inputs, have been sufficient to cause such control circuit portion to have a low impedance path therethrough. In the simple control circuit portion connected to output 20' shown for the subsequent logic gate in FIG. 4, there would be such a path between output 20' and terminating region 18' of the subsequent logic gate provided through transistor 29' being switched into the "on" condition. Output 20' would be and remain in a low voltage state.

The high voltage state at output 20 similarly can only lead to switching an n-channel MOSFET into the "on" condition in the other control circuit portion of the subsequent logic gate connected at an input to output 20. This situation again may or may not lead to providing a low impedance path in such subsequent gate control circuit portion depending on its structure and other inputs. Of course, for the simple subsequent gate control circuit portion connected to gate output 19', such a low impedance path would result between output 19' and terminating region 18' through transistor 28' being switched "on". Output 19' would to to a low voltage state.

Clearly, these considerations lead to concluding that the only change which could occur in the status of the outputs 19' and 20' of the subsequent logic gate (no matter what sort of control circuit portions are connected thereto) would be that both might be brought to a low voltage state. Since the earlier noted design condition is that the current being supplied by transistor 25' will be sufficiently passed by transistor 29' so as not to raise the voltage at output 20 significantly, and the current supplied by transistor 26' will be sufficiently passed by transistor 28' so as not to raise the voltage at output 19', significantly, outputs 19' and 20' of the subsequent logic gate will remain stable in low voltage states for the duration of the disturbance.

Such a condition results in inputs 21" and 24" of the sequel logic gate at the right hand side of FIG. 4 each being in a low voltage state. This erroneous condition, which arose from the drain of transistor 25 of the initial logic gate being charged to a high voltage state, can have no further effect as described earlier in connection with the initial logic gate having both of its inputs in a low voltage state. That is, having both control circuit portions having only high impedance circuit paths therethrough in a logic gate of the kind being described here such as the examples in FIGS. 2 and 3 is an erroneous input state, but one which cannot propagate past the logic gate at which it occurs. Thus, the erroneous condition arising in the initial logic gate at the drain of transistor 25 cannot propagate past the sequel logic gate.

Returning to the postponed description of a common high voltage state condition at the inputs of the initial logic gate, consider again having each of inputs 21 and 24 in the high voltage state due to some error in one of the input logic signals applied thereto. This situation would duplicate the situation occurring at inputs 21' and 24' in the immediately preceding description resulting from a charge generating disturbance occurring at the drain of transistor 25. Thus, such a similar condition would lead to at worst to both outputs 19 and 20 being in the low voltage state, an error which would not propagate past the subsequent logic gate in symmetry with the immediately preceding description.

Hence, logic gates having a cross-coupled switching device plural state circuit portion with a pair of control circuit portions in some part distinct from one another between each output and a gate reference voltage supply can be logic gates which do not propagate charge generating disturbance based errors beyond at most two such logic gates past the source of the error. They will be such logic gates if the control circuit portions can each sufficiently pass currents provided thereto by such plural state circuit portion supplied from another reference voltage. Sufficiently pass means that a control circuit portion can pass a current along any relatively low impedance path established therethrough in response to gate input signals without raising the voltage at the corresponding logic gate output beyond the thresholds of succeeding logic gates having inputs connected to such output.

That is to say, any low impedance path provided in response to gate input signals which goes through a control circuit portion between the output of such a logic gate to which it is connected and the gate terminating region to which it is connected must have a sufficiently low impedance compared to the impedance of the plural state circuit portion between the current supplying terminating region to which it is connected and that same gate output. These impedances must have this relationship to the extent that current supplied through the plural state circuit portion results in a voltage drop across the control circuit portion from the gate output which does not go beyond the threshold voltage value of the next logic gate or gates to which such output is connected.

This requires in CMOS versions of the kind of logic gates being described here that the length-to-width ratios of the n-channel MOSFETS in each control circuit portion be sufficiently small compared to the length-to-width ratio of the cross-coupled p-channel MOSFETS so that each low impedance path which can occur through the control portion will have a sufficient low impedance.

Not only can the logic gates of the kind being described here such as shown in the examples of FIGS. 2 and 3 be used in combinational circuit logic gate arrangements in which there is a desire to prevent charge generating disturbance induced errors from propagating in the arrangement, such gates are also useful in sequential circuits in which data is to be stored such as a latch circuit. This easily appears from the description involving the logic gate arrangement in FIG. 4 since such a latch circuit can be readily constructed by connecting either outputs 19' and 20' to inputs 21 and 24, respectively, or outputs 19" and 20" to inputs 21 and 24 respectively. Such a feedback arrangement will lead to the storing of whatever information is represented by the states at the outputs of these gates as these states will be preserved in such connections within the feedback loop. This can be seen by tracing the various input and output voltage states through the loop and noting they are all consistent with one another.

Since these gates prevented charge generating disturbance based error propagation before the feedback connection was made to the extent described above, they will also prevent propagation of errors within the loop to the same extent to thereby preserve the information contained within the loop. A latch circuit based on outputs 19' and 20' of the subsequent logic gate being connected to the inputs 21 and 24, respectively, of the initial logic gate will prevent errors of all kinds from propagating around the loop with the exception of errors caused by a p-channel MOSFET, connected to an output in a low voltage state, being driven to a high voltage state. To protect against errors propagating around the loop from this sort of a charge generating disturbance, the loop must include all three gates in accord with the above description requiring that the feedback connection be made from outputs 19" and 20" of the sequel gate to inputs 21 and 24 of the initial gate. This gives more complete charge generating disturbance protection.

While the feedback logic gate arrangements discussed for FIG. 4 just above preserve data and provide protection against charge generating disturbance based errors which could destroy such data, latch circuits based on the gate shown in FIG. 4 would not be easily capable of accepting new data from outside circuits since there are no inputs available to insert such data. Such latch circuits could be readily improved by substituting, for example, either the gate shown in FIG. 2 or the gate shown in FIG. 3 for one of the gates shown in FIG. 4. This has been done for the latter instance in FIG. 5 where the gate circuit shown in FIG. 3 has become the initial gate as a substitution for the initial gate shown at the left in FIG. 4. Of course, other gates of the kind being described in connection with the examples shown in FIGS. 2 and 3 could also be substituted for one of the gates shown in FIG. 4 to provide a latch circuit permitting inserting new information into the latch circuit from outside circuits.

The designations for the circuit components and structures shown in FIG. 5 are again those used for comparable components and structures in FIGS. 3 and 4. Once again, the substrate connections have not been shown.

Figure 5:
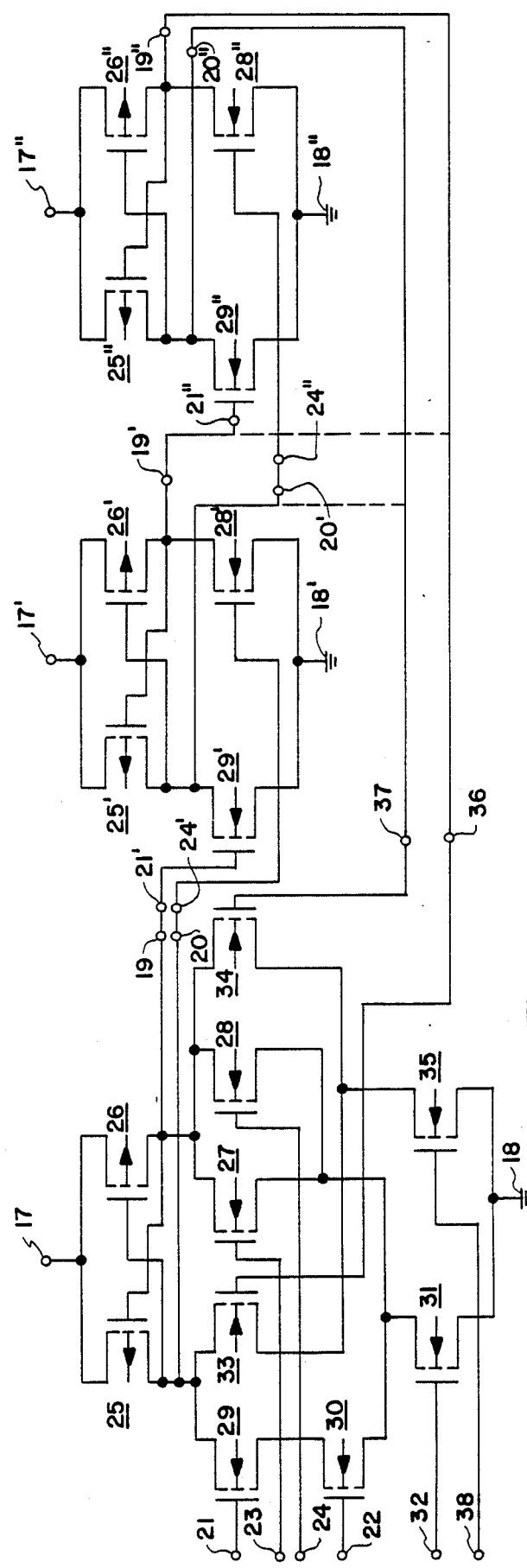

The arrangement of FIG. 5 is controlled at inputs 32 and 38 which direct the logic arrangement to either be in a latch mode not subject to outside circuit inputs, or in an open loop mode susceptible to outside circuit inputs. An input signal applied to input 38 in a high voltage state and the complementary low voltage state input signal applied to input 32 leads to transistor 35 being in the "on" condition while transistor 31 will be in the "off" condition. This situation, in accord with the above description of the FIG. 3 gate, will allow the voltage states on the outputs 19" and 20" of the sequel logic gate at the right hand side of FIG. 5 applied to the gates of the inverter transistors 33 and 34 to affect initial logic gate outputs 19 and 20, thereby completing the feedback loop for the latch circuit. Signals applied at inputs 21 through 24 in this situation will have no effect on circuit operation.

Reversing the input signals voltage states applied to initial logic gate inputs 32 and 38 will eliminate any effect on the initial logic gate of the signals being fed back from outputs 19" and 20", and so break the feedback loop, while the input logic signals applied to initial logic gate inputs 21 and 22 and the complements thereof applied to initial logic gate inputs 23 and 24, respectively, can then direct desired voltage states on initial logic gate outputs 19 and 20. These voltage directed on outputs 18 and 20 will be propagated to the subsequent logic gate at its inputs 21' and 24' to direct the voltage states appearing on its outputs 19' and 20'. These output voltage states in turn are propagated on to the sequel logic gate at its inputs 21" and 24" to direct voltage states on its outputs 19" and 20".

Two dashed lines are shown from outputs 19' and 20' of the subsequent logic gate to initial logic gate inputs 37 and 36, respectively, as an alternative to use of the sequel logic gate in those situations in which two logic gates of the kind being described here, such as those in the examples of FIGS. 2 and 3, provide a latch having sufficient disturbance protection. This may be reasonable in situations where the chances are low of having the drain of a p-channel transistor connected to an output in a low voltage state being forced significantly toward the voltage appearing on terminating region 17. This situation of low likelihood could occur because, as earlier indicated, there is a relatively lower risk of such an event occurring in a CMOS n-well structure integrated circuit and the space saved by not using the sequel gate in latches provides space for other circuits on an integrated circuit chip. Alternatively, a different circuit technology choice, as will be described below, can eliminate the use of p-channel transistors altogether. Of course, a circuit implementation of a logic gate of the kind being described here where an output in a low voltage state cannot be forced into a high voltage state by a charge generating disturbance would mean that two such logic gates in a latch would offer full disturbance protection.

Nevertheless, full protection against charge generating disturbances will typically be desired, and so the for a CMOS circuit implementation including the sequel logic gate in feedback loop will be desired as is shown by the solid line interconnections of FIG. 5. Of course, if only one outside variable is to provide data to be kept in the latch circuit, transistor 30 can be replaced with a short circuit between its drain and source connections while transistor 28 can be replaced with an open circuit between its source and drain connections. On the other hand, if operation according to a complex Boolean expression is to control whether data is presented to the latch circuit, a much more complex n-channel MOSFET arrangement operating in accord with such Boolean expression and its complement can be provided between the drain of transistor 31 and outputs 19 and 20.

As indicated above, logic gates of the kind being described here of which examples are shown in FIGS. 2 and 3 in the CMOS technology can also be constructed in alternative circuit and monolithic integrated circuit technologies. Several of these are shown in the succeeding figures, all without showing the transistor substrate connections. All of the examples in these figures are direct counterparts of the example shown in FIG. 2.

Figure 6:
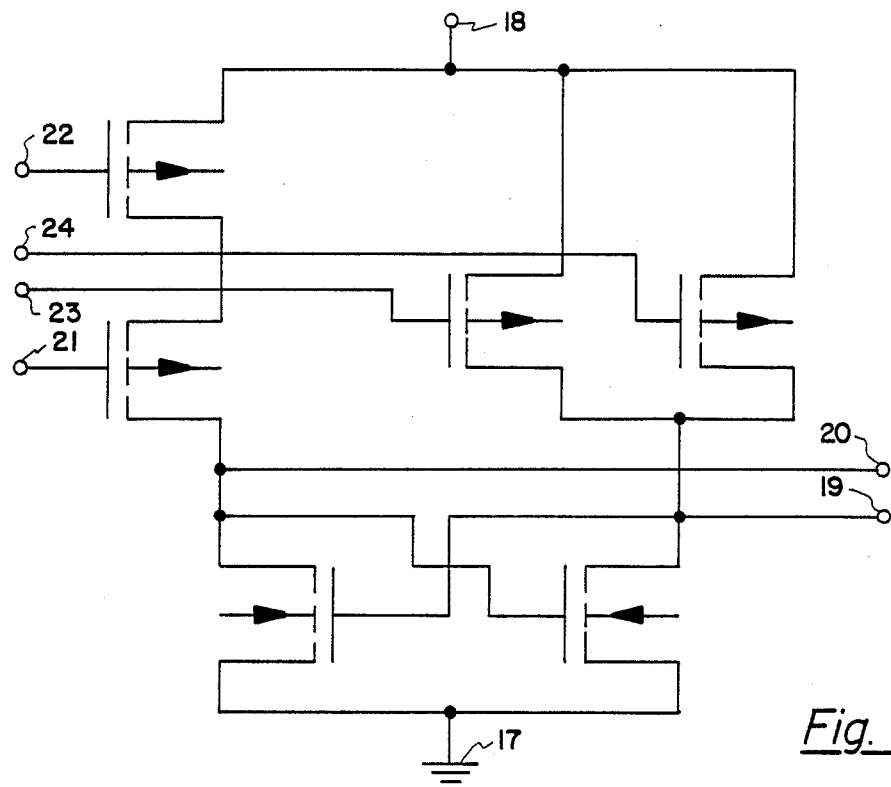

The first of these examples is shown in FIG. 6 where the implementation uses inverted CMOS technology in which the cross-coupled transistors are n-channel MOSFETs and the control circuits comprise p-channel MOSFETs. The logic gate inputs, outputs and terminating regions carry the same numerical designations in FIG. 6 and in the succeeding figures as comparable structures do in FIG. 2. Note that voltage polarity must be reversed in FIG. 6 for terminating regions 17 and 18 from what it is in FIG. 2. In FIG. 6 terminating region 18 is adapted for connection to a relatively positive supply of voltage while terminating region 17 is adapted for connection to a relatively negative supply of voltage, here shown as ground.

The logic gate of FIG. 6 has the threshold voltage values at inputs 21 through 24, beyond which input signals can cause changes in voltage states occurring at outputs 19 and 20, still measured with respect to terminating region 18 and the circuit will behave as the circuit of FIG. 2 did for Boolean variables $x_1$ and $x_2$ if negative logic is used. Any low impedance paths which can be established through either of the control circuit portions between outputs 19 or 20 and terminating region 18 by input signals going beyond such threshold with respect to terminating region 18 should again have an impedance sufficiently low with respect to the impedance through either of the cross-coupled transistors. Sufficiently low again means low enough so that current supplied through the cross-coupled transistors to terminating region 17 will not cause voltage drops with respect to terminating region 18 at outputs 19 and 20 greater than the threshold associated with any input of a succeeding logic gate connected to either of outputs 29 or 20.

Figure 7:
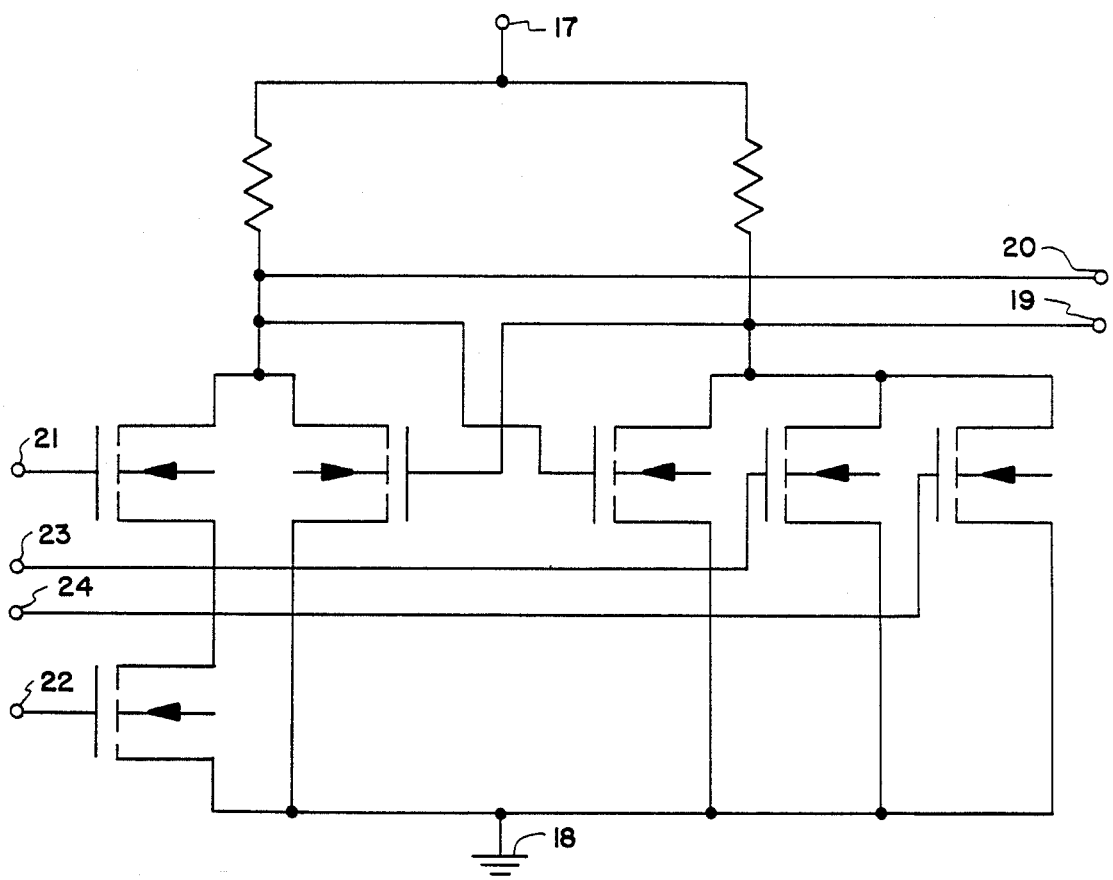
Figure 8:
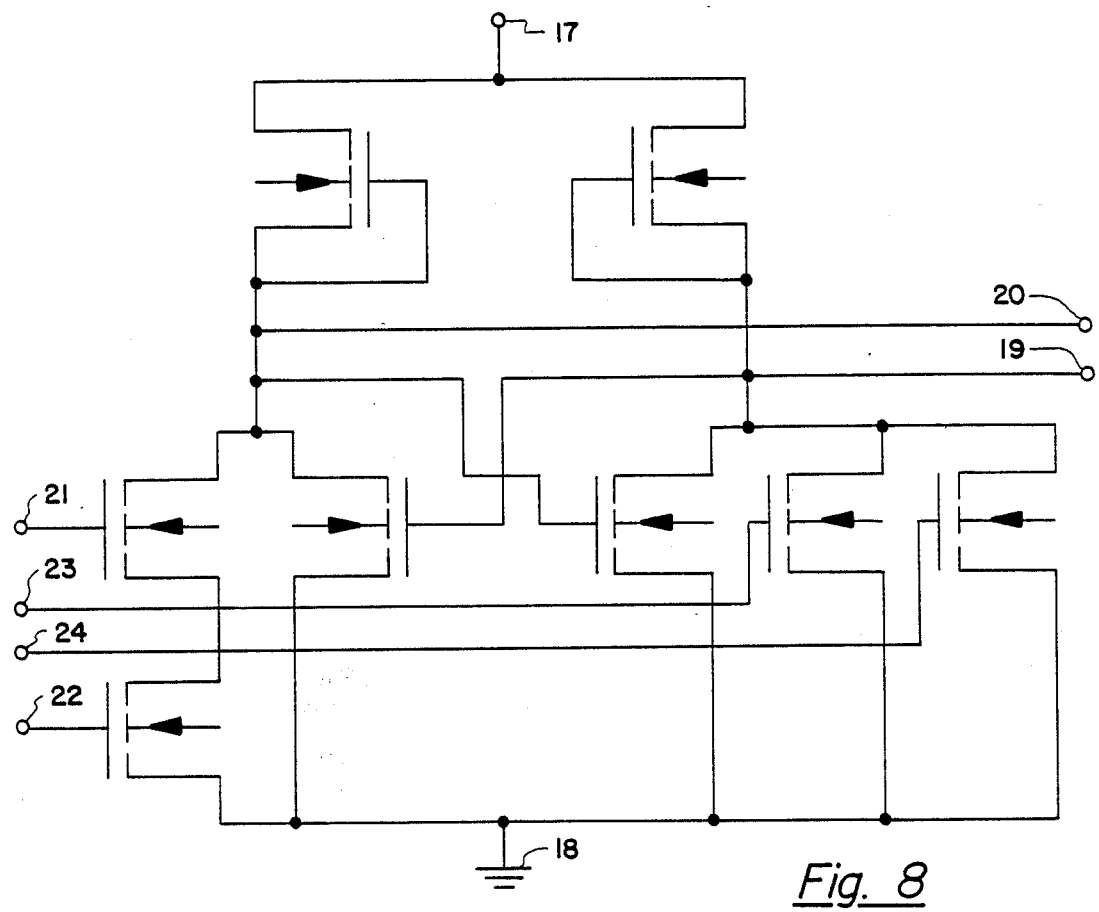

FIGS. 7 and 8 show NMOS field-effect transistor implementations of the kinds of logic gates being described herein, that is, implementations using as transistors only n-channel MOSFETs. However, the cross-coupled transistors in these implementations require added electrical load devices in their drain circuits which were not needed in the previous CMOS implementations. The load devices in FIG. 7 are provided by two resistors, and the load devices in FIG. 8 are provided by two depletion mode n-channel MOSFETs. Thus, the plural state circuit portions in FIGS. 7 and 8, involving these cross-coupled switching devices and the associated load devices, are connected to each of terminating regions 17 and 18 as opposed to the situation in the CMOS circuits where such plural state circuit portions are connected to just one of such gate terminating regions adapted for connection to a supply of voltage.

As in FIGS. 2 and 3, the threshold of the gates voltage values at inputs 21 through 24, beyond which input signals can affect the output voltage states, are measured with respect to terminating region 18 or ground. Again, any low impedance paths established by either control circuit portion between outputs 19 or 20 and terminating region 18 in response to gate input signals must have an impedance thereacross sufficiently low so that current supplied through the load devices of the plural state circuit portion from terminating region 17 will not cause voltage drops across the control circuit portion greater than the thresholds of any such succeeding gate connected to the outputs 19 or 20.

Note there are no p-channel MOSFETs used in the configurations of FIGS. 7 and 8 which means that the outputs 19 or 20 cannot be forced from a low voltage state to a high voltage state as a result of a charge generating disturbance in a switching device terminating region. That is, there is no transistor drain, which suffering a radiation particle impingement, charges positively because, as earlier described, n-type conductivity regions can only be discharged in such circumstances and directed to a lower voltage state. Thus, these are instances where there is never a need to have more than two such logic gates in a cascade or in a latch circuit to assure that an erroneous voltage value state, induced by a charge generating disturbance, would not propagate further in the logic system or destroy information stored in the latch circuit.

Figure 9:
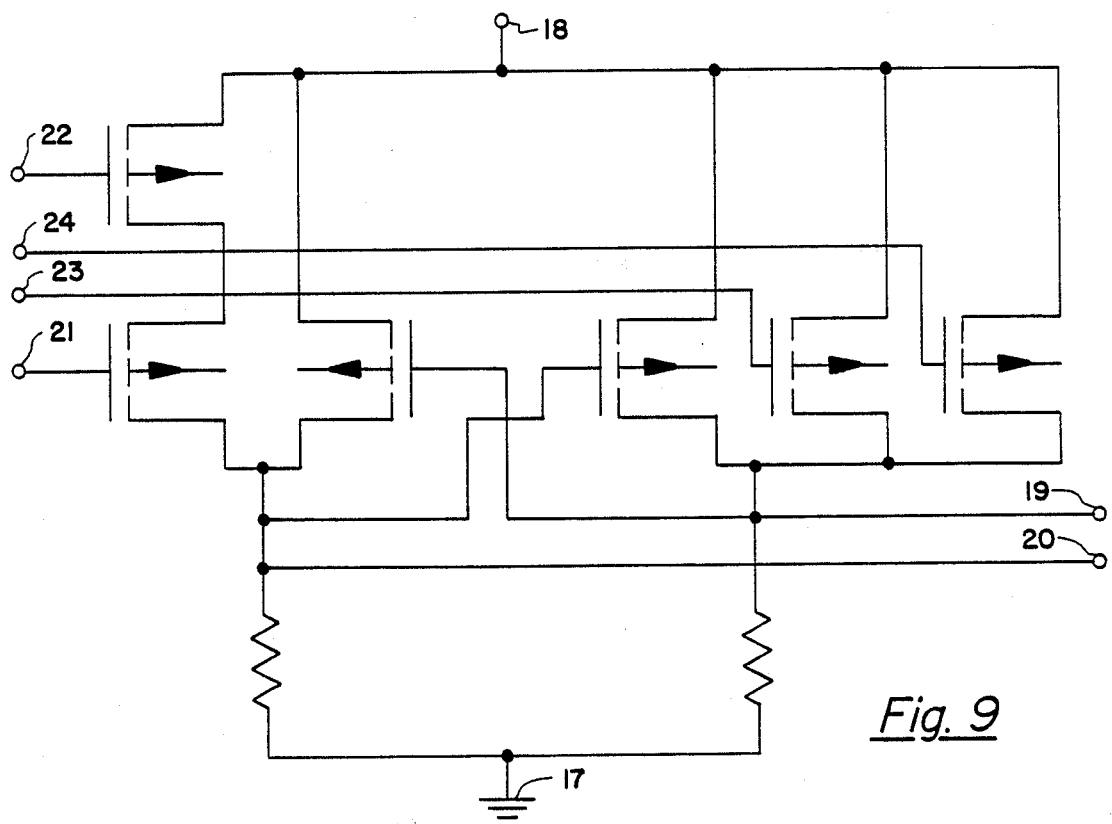

FIG. 9 shows a PMOS field-effect transistor circuit implementation of the kinds of logic gates being described here which is a direct dual to the circuit shown in FIG. 7 again using resistive load devices. These resistive loads could have p-channel depletion mode field-effect transistors substituted for them in the same manner that n-channel depletion mode field-effect transistors are substituted in FIG. 8 for the resistive loads of FIG. 7. As in FIG. 6, the voltage polarities on gate terminating regions 17 and 28 are reversed with 18 being positive relative to 17. The threshold voltage values at inputs 21 through 24 beyond which input signals can affect the output states at outputs 19 and 20 are measured from terminating region 18.

Once more, any low impedance path established in the control circuit portions between outputs 19 or 20 and terminating region 18 by input signals must have an impedance such that currents supplied therethrough from the plural state circuit portion through the resistive loads from terminating region 17 cannot cause a voltage drop across the path in excess of the threshold voltage values, of any succeeding such logic gate. Since there are no n-channel MOSFETs used, the plural state means cannot have an output in a high voltage state changed to a low voltage state because of a transistor drain suffering a radiation particle impingement. So again, only logic gate cascades of two such gates or latch circuits of two such gates are necessary to insure that an erroneous voltage state due to a charge generating disturbance will not propagate further in the logic arrangement or destroy the data stored in the latch circuit.

Of further note, the use of other kinds of logic families, which are not within themselves able to prevent such error propagation, with the kinds of logic gates being described here to achieve some limitation on error propagation is possible. Thus, in FIG. 4 for instance, separate logic gate arrangements from another kind of logic family could be inserted between output 19 and input 21' and between output 20 and input 24', on the one hand, or between output 19' and input 21" and between output 20' and input 24" on the other hand. Properly chosen threshold voltage values at the inputs for these other kinds of logic gates could lead to terminating a disturbance based error occurring ahead of it in the initial logic gate of FIG. 4 or of the subsquent gate of FIG. 4. If such a disturbance based error would propagate further in the cascade because the threshold voltage values of thse other kinds of logic gates are not sufficient, this situation would merely lead to propagating the error to the next logic gate of the kind being described herein where propagation would end. Therefore, the mixing in a logic gate arrangement of logic gates of the kind being described herein with other kinds can be done without necessarily losing the capability to stop errors from propagating throughout the arrangement due to charge generating disturbances.

The embodiments of the invention in which an exclusive property or right is claimed are defined as follows:

1. A logic gate arrangement comprising a logic gate which further comprises:

a plural state circuit means having a plurality of terminating regions, including plural state circuit means first and second terminating regions at each of which a plurality of voltage value states can be caused to alternatively occur, if said plural state circuit means is electrically energized, by establishing at least temporarily a low impedance circuit path from a selected one of said plurality state circuit means first and second terminating regions to a selected terminating region suited for electrical connection to a selected voltage supply, but with each of said plural state circuit means first and second terminating regions being in voltage value states different from one another if free of other kinds of voltage value disturbances sufficient to cause a voltage value state change, and said plural state circuit means having a third terminating region suited for electrical connection to a first voltage supply means;

a common circuit means having an input region serving as signal input for said logic gate, and having a plurality of terminating regions, including first and second terminating regions, said common circuit second terminating region suited for electrical connection to a second voltage supply means, said common circuit means having a first switching device where a switching device is a device having first and second terminating regions and a control region therein by which such switching device is capable of being directed to effectively provide a conductive path of a selected conductivity between its first and second terminating regions, said first switching means first and second terminating regions being effectively connected to said common circuit means first and second terminating regions, respectively, and said first switching device control region is electrically connected to said common circuit means input region;

a designated control circuit means having a plurality of input regions serving as signal inputs for said logic gate, and having a plurality of terminating regions including designated control circuit means first and second terminating regions, said designated control circuit means first terminating region being electrically connected to said plural state circuit means first terminating region which together serve as a signal output for said logic gate, said designated control circuit means second terminating region being electrically connected to said common circuit means first terminating region, said designated control circuit means, if electrically energized, being capable of receiving electrical signals at said designated control circuit input regions and, in response, of establishing at least one low impedance circuit path between said designated control circuit means first and second terminating regions and to respond to others of such electrical signals to establish only relatively high impedance circuit paths between said designated control circuit means first and second terminating regions, and where at least one of said circuit paths in said designated control circuit means at least in part comprises second and third switching devices electrically connected in series between said designated control circuit means first and second terminating regions with one another through said second switching device second terminating region being electrically connected to said third switching device first terminating region; and a complement control circuit means, free of electrical interconnections both from and to said designated control circuit means other than any occurring through said plural state circuit means or said common circuit means, and having a plurality of input regions serving as signal inputs for said logic gate and a plurality of terminating regions including a complement control circuit means first and second terminating regions, said complement control circuit means first terminating region being electrically connected to said plural state circuit means second terminating region which together serve as a signal output for said logic gate, said complement circuit means second terminating region being electrically connected to said common circuit means first terminating region, said complement control circuit means, if electrically energized, being capable of receiving electrical signals at said complement control circuit input regions and, in response, of establishing at least one low impedance circuit path between said complement control circuit means first and second terminating regions and to respond to others of such electrical signals to establish only relatively high impedance circuit paths between said complement control circuit means first and second terminating regions, and where at least one of said circuit paths in said complement control circuit means comprises at least in part a fourth said switching device through said fourth switching device first and second terminating regions.

2. The apparatus of claim 1 wherein said plural state circuit means comprises fifth and sixth switching devices with said fifth and sixth switching devices first terminating regions each being electrically connected together to form said plural state circuit means third terminating region, said fifth switching device second terminating region being electrically connected with said sixth switching device control region to form said plural state circuit means first terminating region, and said sixth switching device second terminating region being electrically connected with said fifth switching device control region to form said plural state circuit means second terminating region.

3. The apparatus of claim 1 wherein said plural state circuit means has a fourth terminating region suited for electrical connection to a third voltage supply means.

4. The apparatus of claim 1 wherein said second switching device first terminating region is electrically connected to, and forms at least part of, said designated control circuit means first terminating region.

5. The apparatus of claim 1 wherein said complement control circuit means further comprises a fifth switching device, said fourth and fifth switching devices first terminating regions each being electrically connected to, and form at least part of, said complement control circuit means first terminating region.

6. The apparatus of claim 1 wherein said designated and complement control circuit means, if electrically energized and receiving complementary input signals at said designated and complement control circuit input regions which are temporarily unchanging, together respond by having one of said designated and complement control circuit means establish a low impedance circuit path between its first and second terminating regions and having that one remaining establish only relatively high impedance circuit paths between its first and second terminating regions.

7. The apparatus of claim 1 wherein said plural state circuit means redesignated as initial plural state circuit means, said common circuit means redesignated as initial common circuit means, said designated control circuit means redesignated as initial designated control circuit means, said complement control circuit means redesignated as initial complement control circuit means together form an initial logic gate, and said logic gate arrangement further comprises a subsequent logic gate comprising:

a subsequent plural state circuit means having a plurality of terminating regions, including subsequent plural state circuit means first and second terminating regions at each of which a plurality of voltage value states can be caused to alternately occur, if said subsequent plural state circuit means is electrically energized, by establishing at least temporarily a low impedance circuit path from a selected one of said subsequent plural state circuit means first and second terminating regions to a selected terminating region suited for electrical connection to a selected voltage supply, but with each of said subsequent plural state circuit means first and second terminating regions being in voltage value states different from one another if free of other kinds of voltage value disturbances sufficient to cause a voltage value state change, and said subsequent plural state circuit means having a third terminating region suited for electrical connection to a third voltage supply means;

a subsequent common circuit means having a plurality of terminating regions, including first and second terminating regions, said second terminating region suited for electrical connection to a fourth voltage supply means, said subsequent common circuit means being capable of providing at least one low impedance circuit path between said subsequent common circuit means first and second terminating regions;

a subsequent designated control circuit means having at least one input region serving as a signal input for said subsequent logic gate with at least one selected such input region being electrically connected to a selected one of said initial logic gate outputs, and having a plurality of terminating regions including subsequent designated control circuit means first and second terminating regions, said subsequent designated control circuit means first terminating region being electrically connected to said subsequent plural state circuit means first terminating region which together serve as a signal output for said subsequent logic gate, said subsequent designated control circuit means second terminating region being electrically connected to said subsequent common circuit means first terminating region, said subsequent designated control circuit means, if electrically energized, being capable of receiving electrical signals at said subsequent designated control circuit input regions, and in response, of establishing at least one low impedance circuit path between said subsequent designated control circuit means first and second terminating regions and to respond to others of such electrical signals to establish only relatively high impedance circuit paths between said subsequent designated control circuit means first and second terminating regions; and a subsequent complement control circuit means, free of electrical interconnections with said subsequent designated control circuit means other than any occurring through said subsequent plural state circuit means or said subsequent common circuit means, and having a plurality of input regions serving as signal inputs for said subsequent logic gate and a plurality of terminating regions including subsequent complement control circuit means first and second terminating regions, said subsequent complement control circuit means first terminating region being electrically connected to said subsequent plural state circuit means second terminating region which together serve as a signal output for said subsequent logic gate, said subsequent complement circuit means second terminating region being electrically connected to said subsequent common circuit means first terminating region, said subsequent complement control circuit means, if electrically energized, being capable of receiving electrical signals at said subsequent complement control circuit input regions, and in response, of establishing at least one low impedance circuit path between said subsequent complement control circuit means first and second terminating regions and to respond to others of such electrical signals to establish only relatively high impedance circuit paths between said subsequent complement control circuit means first and second terminating regions.

8. The apparatus of claim 1 wherein said first, second and third switching devices are insulated gate field-effect transistors.

9. The apparatus of claim 1 wherein said logic gate arrangement further comprises a preceding logic gate comprising:

a preceding plural state circuit means having a plurality of terminating regions, including preceding plural state circuit means first and second terminating regions at each of which a plurality of voltage value states can be caused to alternately occur, if said preceding plural state circuit means is electrically energized, by establishing at least temporarily a low impedance circuit path from a selected one to a selected terminating region suited for electrical connection to a selected voltage supply, but with each of said preceding plural state circuit means first and second terminating regions being in voltage value states different from one another if free of other kinds of voltage value disturbances sufficient to cause a voltage value state change, and said preceding plural state circuit means having a third terminating region suited for electrical connection to a third voltage supply means;

a preceding common circuit means having a plurality of terminating regions, including first and second terminating regions, said second terminating region suited for electrical connection to a fourth voltage supply means, said preceding common circuit means being capable of establishing at least one low impedance circuit path between said preceding common circuit means first and second terminating regions;

a preceding designated control circuit means having at least one input region serving as a signal input for said preceding logic gate, and having a plurality of terminating regions including preceding designated control circuit means first and second terminating regions, said preceding designated control circuit means first terminating region being electrically connected to said preceding plural state circuit means first terminating region which together serve as a signal output for said preceding logic gate and which is electrically connected to a selected one of said initial logic gate inputs, said preceding designated control circuit means second terminating region being electrically connected to said preceding common circuit means first terminating region, said preceding designated control circuit means, if electrically energized, being capable of receiving electrical signals at said preceding designated control circuit input regions, and in response, of establishing at least one low impedance circuit path between said preceding designated control circuit means first and second terminating regions and to respond to others of such electrical signals to establish only relatively high impedance circuit paths between said preceding designated control circuit means first and second terminating regions; and a preceding complement control circuit means, free of electrical interconnections with said preceding designated control circuit means other than any occurring through said preceding plural state circuit means or said preceding common circuit means, and having a plurality of input regions serving as signal inputs for said preceding logic gate and a plurality of terminating regions including preceding complement control circuit means first and second terminating regions, said preceding complement control circuit means first terminating region being electrically connected to said preceding plural state circuit means second terminating region which together serve as a signal output for said preceding logic gate, said preceding complement circuit means second terminating region being electrically connected to said preceding common circuit means said terminating region, said preceding complement control circuit means, if electrically energized, being capable of receiving electrical signals at said preceding complement control circuit input regions, and in response, of establishing at least one low impedance circuit path between said preceding complement control circuit means first and second terminating regions and to respond to others of such electrical signals to establish only relatively high impedance circuit paths between said preceding complement control circuit means first and second terminating regions.

10. The apparatus of claim 2 wherein said fifth and sixth switching devices are p-channel insulated gate field-effect transistors, said fifth and sixth switching devices first terminating regions each being a source, and said plural state circuit means third terminating region being adapted for electrical connection to a supply of relatively positive voltage.

11. The apparatus of claim 2 wherein said fifth and sixth switching devices are n-channel insulated gate field-effect transistors, said fifth and sixth switching devices first terminating regions each being a source, and said plural state circuit means third terminating region being adapted for electrical connection to a supply of relatively negative voltage.

12. The apparatus of claim 7 wherein a selected one of said subsequent logic gate outputs is electrically connected to a selected one of said initial logic gate inputs.

13. The apparatus of claim 7 wherein said selected subsequent designated control circuit means input region is directly electrically connected to said selected one of said initial logic gate outputs.

14. The apparatus of claim 7 wherein said logic gate arrangement further comprises a sequel logic gate comprising;

a sequel plural state circuit means having a plurality of terminating regions, including sequel plural state circuit means first and second terminating regions at each of which a plurality of voltage value states can be caused to alternately occur, if said sequel plural state circuit means is electrically energized, by establishing at least temporarily a low impedance circuit path from a selected one of said sequel plural state circuit means first and second terminating regions to a selected terminating region suited for electrical connection to a selected voltage supply, but with each of said sequel plural state circuit means first and second terminating regions being in voltage value states different from one another if free of other kinds of voltage value disturbances sufficient to cause a voltage value state change, and said sequel plural state circuit means having a third terminating region suited for electrical connection to a fifth voltage supply means;

a sequel common circuit means having a plurality of terminating regions, including first and second terminating regions, said second terminating region suited for electrical connection to a sixth voltage supply means, said sequel common circuit means being capable of providing at least one low impedance circuit path between said sequel common circuit means first and second terminating regions;

a sequel designated control circuit means having at least one input region serving as a signal input for said sequel logic gate with at least one selected such input region being electrically connected to a selected one of said subsequent logic gate outputs, and having a plurality of terminating regions including sequel designated control circuit means first and second terminating regions, said sequel designated control circuit means first terminating region being electrically connected to said sequel plural state circuit means first terminating region which together serve as a signal output for said sequel logic gate, said sequel designated control circuit means second terminating region being electrically connected to said sequel common circuit means first terminating region, said sequel designated control circuit means, if electrically energized, being capable of receiving electrical signals at said sequel designated control circuit input regions, and in response, of establishing at least one low impedance circuit path between said sequel designated control circuit means first and second terminating regions and to respond to others of such electrical signals to establish only relatively high impedance circuit paths between said sequel designated control circuit means first and second terminating regions; and a sequel complement control circuit means free of electrical interconnections with said sequel designated control circuit means other than any occurring through said sequel plural state circuit means or said sequel common circuit means, and having a plurality of input regions serving as signal inputs for said sequel logic gate and a plurality of terminating regions including sequel complement control circuit means first and second terminating regions, said sequel complement control circuit means first terminating region being electrically connected to said sequel plural state circuit means second terminating region which together serve as a signal output for said final logic gate, said sequel complement circuit means second terminating region being electrically connected to said sequel common circuit means second terminating region, said sequel complement control circuit means, if electrically energized, being capable of receiving electrical signals at said sequel complement control circuit input regions, and in response, of establishing at least one low impedance circuit path between said sequel complement control circuit means first and second terminating regions and to respond to others of such electrical signals to establish only relatively high impedance circuit paths between said sequel complement control circuit means first and second terminating regions.

15. The apparatus of claim 12 wherein said first voltage supply means and said third voltage supply means are a common voltage supply means, and said second voltage supply means and said fourth voltage supply means are a common voltage supply means.

16. The apparatus of claim 14 wherein a selected one of said sequel gate outputs is electrically connected to a selected one of said initial logic gate inputs.

17. The apparatus of claim 14 wherein said selected sequel designated control circuit means input region is directly electrically connected to said selected one of said subsequent logic gate outputs.

18. The apparatus of claim 16 wherein said first voltage supply means, said third voltage supply means and said fifth voltage supply means are a single common voltage supply means, and said second voltage supply means said fourth voltage supply means and said sixth voltage supply means are a single common voltage supply means.

19. A logic gate arrangement comprising a logic gate which further comprises:

a plural state circuit means having a plurality of terminating regions, including plural state circuit means first and second terminating regions at each of which a plurality of voltage value states can be caused to alternatively occur, if said plural state circuit means is electrically energized, by establishing at least temporarily a low impedance circuit path from a selected one of said plural state circuit means first and second terminating regions to a selected terminating region suited for electrical connection to a selected voltage supply, but with each of said plural state circuit means first and second terminating regions being in voltage value states different from one another if free of other kinds of voltage value disturbances sufficient to cause a voltage value state change, and said plural state circuit means having a third terminating region suited for electrical connection to a first voltage supply means;

a common circuit means having an input region serving as signal input for said logic gate, and having a plurality of terminating regions, including first, second and third terminating regions, said common circuit second terminating region suited for electrical connection to a second voltage supply means, said common circuit means having first and second switching devices where a switching device is a device having first and second terminating regions and a control region therein by which such switching device is capable of being directed to effectively provide a conductive path of a selected conductivity between its first and second terminating regions, said first switching device first and second terminating regions being effectively connected to said common circuit means first and second terminating regions, respectively, said first switching device control region is electrically connected to said common circuit means input region, said second switching device being contained in a circuit path between said common circuit means second and third terminating regions, and said second switching device having a control region therein serving as a signal input for said logic gate;

a designated control circuit means having a plurality of input regions serving as signal inputs for said logic gate, and having a plurality of terminating regions including designated control circuit means first, second and third terminating regions, said designated control circuit means first terminating region being electrically connected to said plural state circuit means first terminating region which together serve as a signal output for said logic gate, said designated control circuit means second terminating region being electrically connected to said common circuit means first terminating region, said designated control circuit means second terminating region being electrically connected to said common circuit means third terminating region, said designated control circuit means, if electrically energized, being capable of receiving electrical signals at said designated control circuit input regions and, in response, of establishing at least one low impedance circuit path between said designated control circuit means first and second terminating regions and to respond to others of such electrical signals to establish only relatively high impedance circuit paths between said designated control circuit means first and second terminating regions, and where at least one of said circuit paths in said designated control circuit means at least in part comprises third and fourth switching devices electrically connected in series between said designated control circuit means first and second terminating regions and with one another through said third switching device second terminating region being electrically connected to said fourth switching device first terminating region; and a complement control circuit means, free of electrical interconnections both from and to said designated control circuit means other than any occurring through said plural state circuit means or said common circuit means, and having a plurality of input regions serving as signal inputs for said logic gate and a plurality of terminating regions including a complement control circuit means first, second and third terminating regions, said complement control circuit means first terminating region being electrically connected to said plural state circuit means second terminating region which together serve as a signal output for said logic gate, said complement circuit means second terminating region being electrically connected to said common circuit means first terminating region, said complement circuit means second terminating region being electrically connected to said common circuit means third terminating region, said complement control circuit means, if electrically energized, being capable of receiving electrical signals at said complement control circuit input regions and, in response, of establishing at least one low impedance circuit path between said complement control circuit means first and second terminating regions and to respond to others of such electrical signals to establish only relatively high impedance circuit paths between said complement control circuit means first and second terminating regions, and where at least one of said circuit paths in said complement control circuit means comprises at least in part a fifth said switching device through said fifth switching device first and second terminating regions.

20. The apparatus of claim 19 wherein said designated and complement control circuit means, if electrically energized and receiving complementary input signals at said designated and complement control circuit input regions, respectively, as aforesaid, together respond, if such signals received on such input regions are at least temporarily unchanging, by having one of said designated and complement control circuit means establish a low impedance circuit path between its first and second terminating regions and having that one remaining establish only relatively high impedance circuit paths between its first and second terminating regions.

21. A logic gate arrangement comprising a logic gate which further comprises:

a plural state circuit means having a plurality of terminating regions, including plural state circuit means first, second, third and fourth terminating regions, said plural state circuit means comprising first and second p-channel insulated gate field-effect transistors each having a source electrically connected to said plural state circuit means third terminating region, said first transistor having its collector electrically connected to a gate of said second transistor to form said plural state circuit means first terminating region, and said second transistor having its collector electrically connected with a gate of said first transistor to form said plural state circuit means second terminating region, said plural state circuit means first and second terminating regions each being electrically connected by a load means to said plural state means fourth terminating region, said plural state circuit means and said third terminating region suited for electrical connection to a first voltage supply means of a relatively positive voltage, and said fourth terminating region suited for electrical connection to a supply of a relatively negative voltage;

a common circuit means having an input region serving as signal input for said logic gate, and having a plurality of terminating regions, including first and second terminating regions, said common circuit second terminating region suited for electrical connection to a second voltage supply means, said common circuit means having a first switching device where a switching device is a device having first and second terminating regions and a control region therein by which such switching device is capable of being directed to effectively provide a conductive path of a selected conductivity between its first and second terminating regions, said first switching device first and second terminating regions being effectively connected to said common circuit means first and second terminating regions, respectively, and said first switching device control region is electrically connected to said common circuit means input region;

a designated control circuit means having a plurality of input regions serving as signal inputs for said logic gate, and having a plurality of terminating regions including designated control circuit means first and second terminating regions, said designated control circuit means first terminating region being electrically connected to said plural state circuit means first terminating region which together serve as a signal output for said logic gate, said designated control circuit means second terminating region being electrically connected to said common circuit means first terminating region, said designated control circuit means, if electrically energized, being capable of receiving electrical signals at said designated control circuit input regions and, in response, of establishing at least one low impedance circuit path between said designated control circuit means first and second terminating regions and to respond to others of such electrical signals to establish only relatively high impedance circuit paths between said designated control circuit means first and second terminating regions, and where at least one of said circuit paths in said designated control circuit means at least in part comprises second and third switching devices electrically connected in series between said designated control circuit means first and second terminating regions and with one another through said third switching device second terminating region being electrically connected to said second switching device first terminating region; and a complement control circuit means, free of electrical interconnections both from and to said designated control circuit means other than any occurring through said plural state circuit means or said common circuit means, and having a plurality of input regions serving as signal inputs for said logic gate and a plurality of terminating regions including a complement control circuit means first and second terminating regions, said complement control circuit means first terminating region being electrically connected to said plural state circuit means second terminating region which together serve as a signal output for said logic gate, said complement circuit means second terminating region being electrically connected to said common circuit means first terminating region, said complement control circuit means, if electrically energized, being capable of receiving electrical signals at said complement control circuit input regions and, in response, of establishing at least one low impedance circuit path between said complement control circuit means first and second terminating regions and to respond to others of such electrical signals to establish only relatively high impedance circuit paths between said complement control circuit means first and second terminating regions, and where at least one of said circuit paths in said complement control circuit means comprises at least in part a fourth said switching device through said fourth switching device first and second terminating regions.

22. A logic gate arrangement comprising a logic gate which further comprises:

a plural state circuit means having a plurality of terminating regions, including plural state circuit means first, second, third and fourth terminating regions, said plural state circuit means comprising first and second n-channel insulated gate field-effect transistors each having a source electrically connected to said plural state circuit means third terminating region, said first transistor having its collector electrically connected to a gate of said second transistor to form said plural state circuit means first terminating region, and said second transistor having its collector electrically connected to a gate of said first transistor to form said plural state circuit means second terminating region, said plural state circuit means first and second terminating regions each being electrically connected by a load means to said plural state means fourth terminating region, said plural state circuit means said third terminating region suited for electrical connection to a first voltage supply means of a relatively negative voltage, and said fourth terminating region suited for electrical connection to a supply of relatively positive voltage;

a common circuit means having an input region serving as signal input for said logic gate, and having a plurality of terminating regions, including first and second terminating regions, said common circuit second terminating region suited for electrical connection to a second voltage supply means, said common circuit means having a first switching device where a switching device is a device having first and second terminating regions and a control region therein by which such switching device is capable of being directed to effectively provide a conductive path of a selected conductivity between its first and second terminating regions, said first switching device first and second terminating regions being effectively connected to said common circuit means first and second terminating regions, respectively, and said first switching device control region is electrically connected to said common circuit means input region;

a designated control circuit means having a plurality of input regions serving as signal inputs for said logic gate, and having a plurality of terminating regions including designated control circuit means first and second terminating regions, said designated control circuit means first terminating region being electrically connected to said plural state circuit means first terminating region which together serve as a signal output for said logic gate, said designated control circuit means second terminating region being electrically connected to said common circuit means first terminating region, said designated control circuit means, if electrically energized, being capable of receiving electrical signals at said designated control circuit input regions and, in response, of establishing at least one low impedance circuit path between said designated control circuit means first and second terminating regions and to respond to others of such electrical signals to establish only relatively high impedance circuit paths between said designated control circuit means first and second terminating regions, and where at least one of said circuit paths in said designated control circuit means at least in part comprises second and third switching devices electrically connected in series between said designated control circuit means first and second terminating regions and with one another through said third switching device second terminating region being electrically connected to said second switching device first terminating region; and a complement control circuit means, free of electrical interconnections both from and to said designated control circuit means other than any occurring through said plural state circuit means or said common circuit means, and having a plurality of input regions serving as signal inputs for said logic gate and a plurality of terminating regions including a complement control circuit means first and second terminating regions, said complement control circuit means first terminating region being electrically connected to said plural state circuit means second terminating region which together serve as a signal output for said logic gate, said complement circuit means second terminating region being electrically connected to said common circuit means first terminating region, said complement control circuit means, if electrically energized, being capable of receiving electrical signals at said complement control circuit input regions and, in response, of establishing at least one low impedance circuit path between said complement control circuit means first and second terminating regions and to respond to others of such electrical signals to establish only relatively high impedance circuit paths between said complement control circuit means first and second terminating regions, and where at least one of said circuit paths in said complement control circuit means comprises at least in part a fourth said switching device through said fourth switching device first and second terminating regions.

23. A logic gate arrangement for purposes of maintaining proper operation if subjected to ionizing radiation comprising: an initial logic gate comprising:

an initial gate plural state circuit means having a plurality of terminating regions, including initial gate plural state circuit means first and second terminating regions at each of which a plurality of voltage value states can be caused to alternatively occur, if said initial gate plural state circuit means is electrically energized, by establishing at least temporarily a low impedance circuit path from a selected one of said initial plural state circuit means first and second terminating regions to a selected terminating region suited for electrical connection to a selected voltage supply, but with each of said initial gate plural state circuit means first and second terminating regions being in voltage value states different from one another if free of other kinds of voltage value disturbances sufficient to cause a voltage state change, and said initial gate plural state circuit means having a third terminating region suited for electrical connection to a first voltage means; and an initial gate control circuit means having a plurality of input regions serving as signal inputs for said initial logic gate, and having a plurality of terminating regions including first, second and third terminating regions, said initial gate control circuit means first terminating region being electrically connected to said initial gate plural state circuit means first terminating region which together serve as a signal output for said initial logic gate, said initial gate control circuit means second terminating region being electrically connected to said initial gate plural state circuit means second terminating region which together serve as a signal output for said initial logic gate, and said initial gate control circuit means third terminating region being suited for electrical connection to a second voltage supply means, said initial gate control circuit means, if electrically energized, being capable of receiving electrical signals at said initial gate control circuit input regions and, in response, of (i) establishing at least one low impedance circuit path between (a) a selected one of said initial gate control circuit means first and second terminating regions, and (b) said initial gate control circuit means third terminating region, and (ii) establishing only relatively high impedance circuit paths between that remaining initial gate control circuit means terminating region and said initial gate control circuit means third terminating region; and a subsequent logic gate comprising at least one input region, at least one output region and a plurality of terminating regions at least two of which are suited for electrical connection to selected voltage supply means, said subsequent logic gate, if electrically energized, being capable of changing between those voltage value states which can occur on said subsequent logic gate output in response to one or more input voltage value signals received at selected ones of said subsequent logic gate input regions which signals are of a value that equals or goes beyond that threshold voltage value for each of said selected input regions necessary to give effect to such input voltage value signal in causing said changing between voltage value states on said subsequent logic gate output, said subsequent logic gate having at least a selected one of said initial logic gate outputs electrically connected to at least one selected said subsequent logic gate input region, and with said initial gate control circuit means having any said low impedance circuit path established therein as aforesaid being of a sufficiently low impedance so that any circuit current that can be supplied therealong through said initial gate plural state circuit means in any state thereof will cause a voltage drop across such circuit path that is smaller in absolute value than that of said threshold voltage value associated with that said subsequent logic gate input region that is electrically connected, as aforesaid, to said initial logic gate output.

24. The apparatus of claim 23 wherein said initial gate plural state circuit means comprises first and second switching devices, where a switching device is a device having first and second terminating regions and a control region therein by which such switching device is capable of being directed to effectively provide a conductive path of a selected conductivity between its first and second terminating regions, said first and second switching devices first terminating regions each being electrically connected together to form said initial gate plural state circuit means third terminating region; said first switching device second terminating region being electrically connected with said second switching device control region to form said initial gate plural state circuit means first terminating region, and said second switching device second terminating region being electrically connected with said first switching device control region to form said initial gate plural state circuit means second terminating region.

25. The apparatus of claim 23 wherein said initial gate plural state circuit means has a fourth terminating region suited for electrical connection to a third voltage supply means.

26. The apparatus of claim 23 wherein a selected one of said subsequent logic gate outputs is electrically connected to a selected one of said initial logic gate inputs.

27. The apparatus of claim 23 wherein said selected one of said subsequent logic gate inputs is directly electrically connected to said selected one of said initial logic gate outputs.

28. The apparatus of claim 23 wherein said initial gate control circuit means comprises first and second switching devices, where a switching device is a device having first and second terminating regions and a control region therein by which such switching device is capable of being directed to effectively provide a conductive path of a selected conductivity between its first and second terminating regions, said first switching device first and second terminating regions being electrically connected between said initial gate control circuit means first and third terminating regions, and said second switching device first and second terminating regions being electrically connected between said initial gate control circuit means second and third terminating regions, where each of said first switching device control region and second switching device control region is a signal input for said initial logic gate.

29. The apparatus of clam 23 wherein said subsequent logic gate further comprises:

a subsequent gate plural state circuit means having a plurality of terminating regions, including subsequent gate plural state circuit means first and second terminating regions at each of which a plurality of voltage value states can be caused to alternately occur, if said subsequent plural state circuit means is electrically energized, by establishing at least temporarily a low impedance circuit path from a selected one of said subsequent gate plural state circuit means first and second terminating regions to a selected terminating region suited for electrical connection to a selected voltage supply, but with each of said subsequent gate plural state circuit means first and second terminating regions being in voltage value states different from one another if free of other kinds of other voltage value disturbances sufficient to cause a voltage value state change, and said subsequent plural state circuit means having a third terminating region suited for electrical connection to a third voltage supply means; and a subsequent gate control circuit means having a plurality of input regions serving as signal inputs for said subsequent logic gate, and having a plurality of terminating regions including first, second and third terminating regions, said subsequent gate control circuit means first terminating region being electrically connected to said subsequent plural state circuit means first terminating region which together serve as a signal output for said subsequent logic gate, said subsequent gate control circuit means second terminating region being electrically connected to said subsequent gate plural state circuit means second terminating region which together serve as a signal output for said subsequent logic gate, and said subsequent gate control circuit means third terminating region being suited for electrical connection to a fourth voltage supply means, said subsequent gate control circuit means, if electrically energized, being capable of receiving electrical signals at said subsequent gate control circuit input regions and, in response, of (i) establishing at least one low impedance circuit path between (a) a selected one of said subsequent gate control circuit means first and second terminating regions, and (b) said subsequent gate control circuit means third terminating region, and (ii) establishing only relatively high impedance circuit paths between that remaining subsequent gate control circuit means terminating region and said subsequent gate control circuit means third terminating region.

30. The apparatus of claim 24 wherein said first and second switching devices are p-channel insulated gate field-effect transistors, said first and second switching devices first terminating regions each being a source, and said initial gate plural state circuit means third terminating region being suited for electrical connection to a supply of relatively positive voltage.

31. The appparatus of claim 24 wherein said first and second switching devices are n-channel insulated gate field-effect transistors, said first and second switching devices first terminating regions each being a source, and said initial gate plural state circuit means third terminating region being suited for electrical connection to a supply of relatively negative voltage.

32. The apparatus of claim 24 wherein said initial gate control circuit means comprises third and fourth switching devices, said third switching device first and second terminating regions being electrically connected between said initial gate control circuit means first and third terminating regions, and said fourth switching device first and second terminating regions being electrically connected between said initial gate control circuit means second and third terminating regions, where each of said third switching device control region and said fourth switching device control region is a signal input for said initial logic gate.

33. The apparatus of claim 26 wherein said initial logic gate plural state circuit means comprises first and second switching devices, where a switching device is a device having first and second terminating regions and a control region therein by which such switching device is capable of being directed to effectively provide a conductive path of a selected conductivity between its first and second terminating regions, said first and second switching devices first terminating regions each being electrically connected together to form said initial gate plural state circuit means third terminating region, said first switching device second terminating region being electrically connected with said second switching device control region to form said initial plural state circuit means first terminating region, and said second switching device second terminating region being electrically connected with said first switching device control region to form said initial gate plural state circuit means second terminating region, and wherein said initial gate control circuit means comprises third and fourth switching devices, said third switching device first and second terminating regions being electrically connected between said initial gate control circuit means first and third terminating regions, and said fourth switching device first and second terminating regions being electrically connected between said initial gate control means second and third terminating regions, where each of said third switching device control region and said fourth switching device control region is a signal input for said initial logic gate.

34. The apparatus of claim 28 wherein said first switching device first terminating region is electrically connected to said initial gate control circuit means first terminating region, said first switching device second terminating region is electrically connected to said initial gate control circuit means third terminating region, said second switching device first terminating region is electrically connected to said initial gate control circuit means second terminating region, and said second switching device second terminating region is electrically connected to said initial gate control circuit means third terminating regions.

35. The apparatus of claim 29 wherein said logic gate arrangement further comprises a sequel logic gate comprising at least one input region, at least one output region and a plurality of terminating regions at least two of which are suited for electrical connection to selected voltage supply means, said sequel logic gate, if electrically energized, being capable of changing between those voltage value states which can occur on said sequel logic gate output in response to one or more input voltage value signals received at selected ones of said sequel logic gate input regions which signals are of a value that equals or goes beyond that threshold voltage value for each of said selected input regions necessary to give effect to such input voltage value signal in causing said changing between voltage value states on said sequel logic gate output, said sequel logic gate having at least a selected one of said subsequent logic gate outputs electrically connected to at least one selected said sequel logic gate input region, and with said subsequent gate control circuit means having any said low impedance path established therein as aforesaid being of a sufficiently low impedance so that any circuit current that can be supplied there along by said subsequent gate plural state circuit means in any state thereof will cause a voltage drop across such circuit path that is smaller in absolute value than that of said threshold voltage value associated with that said sequel logic gate input region that is electrically connected, as aforesaid, to said subsequent logic gate output.

36. The apparatus of claim 29 wherein said initial gate plural state circuit means comprises first and second switching devices, where a switching device is a device having first and second terminating regions and a control region therein by which such switching device is capable of being directed to effectively provide a conductive path of a selected conductivity between its first and second terminating regions, said first and second switching devices first terminating regions each being electrically connected together to form said initial gate plural state circuit means third terminating region, said first switching device second terminating region being electrically connected with said second switching device control region to form said initial gate plural state circuit means first terminating region, and said second switching device second terminating region being electrically connected with said first switching device control region to form said initial plural state circuit means second terminating region, and wherein said subsequent gate plural state circuit means comprises third and fourth switching devices, said third and fourth switching devices first terminating regions each being electrically connected together to form said subsequent gate plural state circuit means third terminating region, said third switching device second terminating region being electrically connected with said fourth switching device control region to form said subsequent gate plural state circuit means first terminating region, and said fourth switching device second terminating region being electrically connected with said third switching device control region to form said subsequent gate plural state circuit means second terminating region.

37. The apparatus of claim 29 wherein said first voltage supply means and said third voltage supply means are a common voltage supply means, and said second voltage supply means and said fourth voltage supply means are a common voltage supply means.

38. The apparatus of claim 32 wherein said third switching device first terminating region is electrically connected to said initial gate control circuit means first terminating region, said third switching device second terminating region is electrically connected to said initial gate control circuit means third terminating region, said fourth switching device first terminating region is electrically connected to said initial gate control circuit means second terminating region, and said fourth switching device second terminating region is electrically connected to said initial gate control circuit means third terminating regions.

39. The apparatus of claim 33 wherein said third switching device first terminating region is electrically connected to said initial gate control circuit means first terminating region and its second terminating region is electrically connected to said initial gate control circuit means third terminating region, and said fourth switching device first terminating region is electrically connected to said initial gate control circuit means second terminating region and its second terminating region is electrically connected to said initial gate control circuit means third terminating region.

40. The apparatus of claim 35 wherein a selected one of said sequel logic gate outputs is electrically connected to a selected one of said initial logic gate inputs.

41. The apparatus of claim 35 wherein said selected one of said sequel logic gate input regions is directly electrically connected to said selected one of said subsequent logic gate outputs.

42. The apparatus of claim 35 wherein said sequel logic gate further comprises;

a sequel gate plural state circuit means having a plurality of terminating regions, including sequel gate plural state circuit means first and second terminating regions at each of which a plurality of voltage value states can be caused to alternately occur, if said sequel gate plural state circuit means is electrically energized, by establishing at least temporarily a low impedance circuit path from a selected one of said sequel gate plural state circuit means first and second terminating regions to a selected terminating region suited for electrical connection to a selected voltage supply, but with each of said sequel gate plural state circuit means first and second terminating regions being in voltage value states different from one another if free of other kinds of other voltage value disturbances sufficient to cause a voltage value state change, and said sequel plural state circuit means having a third terminating region suited for electrical connection to a fifth voltage supply means; and a sequel gate control circuit means having a plurality of input regions serving as signal inputs for said sequel logic gate, and having a plurality of terminating regions including first, second and third terminating regions, said sequel gate control circuit means first terminating region being electrically connected to said sequel gate plural state circuit means first terminating region which together serve as a signal output for said sequel logic gate, said sequel gate control circuit means second terminating region being electrically connected to said sequel gate plural state circuit means second terminating region which together serve as a signal output for said sequel logic gate, and said sequel gate control circuit means third terminating region being suited for electrical connection to a sixth voltage supply means, said sequel gate control circuit means, if electrically energized, being capable of receiving electrical signals at said sequel gate control circuit input regions and, in response, of (i) establishing at least one low impedance circuit path between (a) a selected one of said sequel gate control circuit means first and second terminating regions, and (b) said sequel gate control circuit means third terminating region, and (ii) establishing only relatively high impedance circuit paths between that remaining sequel gate control circuit means terminating region and said sequel gate control circuit means third terminating region.

43. The apparatus of claim 36 wherein said initial gate control circuit means comprises fifth and sixth switching devices, said fifth switching device first terminating region being electrically connected to said initial gate control circuit means first terminating region, and said sixth switching device first terminating region being electrically connected to said initial gate control circuit means second terminating region, and wherein said subsequent gate control circuit means comprises seventh and eighth switching devices, said seventh switching device first terminating region being electrically connected to said subsequent gate control circuit means first terminating region, and said eighth switching device first terminating region being electrically connected to said subsequent gate control circuit means second terminating region, where each of said fifth switching device control region and said sixth switching device control region is a signal input for said initial logic gate, and where each of said seventh switching device control region and said eighth switching device control region is a signal input for said subsequent logic gate.

44. The apparatus of claim 40 wherein said initial logic gate plural state circuit means comprises first and second switching devices, where a switching device is a device having first and second terminating regions and a control region therein by which such switching device is capable of being directed to effectively provide a conductive path of a selected conductivity between its first and second terminating regions, said first and second switching devices first terminating regions each being electrically connected together to form said initial gate plural state circuit means third terminating region, said first switching device second terminating region being electrically connected with said second switching device control region to form said initial gate plural state circuit means first terminating region, and said second switching device second terminating region being electrically connected with said first switching device control region to form said initial gate plural state circuit means second terminating region, and wherein said initial gate control circuit means comprises third and fourth switching devices, said third switching device first terminating region being electrically connected to said initial gate control circuit means first terminating region, and said fourth switching device first terminating region being electrically connected to said initial gate control means second terminating region where each of said third switching device control region and said fourth switching device control region is a signal input for said initial logic gate.

45. The apparatus of claim 42 wherein said initial gate plural state circuit means comprises first and second switching devices, where a switching device is a device having first and second terminating regions and a control region therein by which such switching device is capable of being directed to effectively provide a conductive path of a selected conductivity between its first and second terminating regions, said first and second switching devices first terminating regions each being electrically connected together to form said initial gate plural state circuit means third terminating region, said first switching device second terminating region being electrically connected with said second switching device control region to form said initial gate plural state circuit means first terminating region, and said second switching device second terminating region being electrically connected with said first switching device control region to form said initial gate plural state circuit means second terminating region, wherein said subsequent gate plural state circuit means comprises third and fourth switching devices, said third and fourth switching devices first terminating regions each being electrically connected together to form said subsequent gate plural state circuit means third terminating region, said third switching device second terminating region being electrically connected with said fourth switching device control region to form said subsequent gate plural state circuit means first terminating region, and said fourth switching device second terminating region being electrically connected with said third switching device control region to form said subsequent gate plural state circuit means second terminating region, and wherein said sequel gate plural state circuit means comprises fifth and sixth switching devices, said fifth and sixth switching devices first terminating regions each being electrically connected together to form said sequel gate plural state circuit means third terminating region, said fifth switching device second terminating region being electrically connected with said sixth switching device control region to form said sequel gate plural state circuit means first terminating region, and said sixth switching device second terminating region being electrically connected with said fifth switching device control region to form said sequel gate plural state circuit means second terminating region.

46. The apparatus of claim 42 wherein said first voltage supply means, said third voltage supply means and said fifth voltage supply means are a common voltage supply means, said second voltage supply means, said fourth voltage supply means and said sixth voltage supply means are a common voltage supply means.

47. The apparatus of claim 43 wherein said fifth switching device second terminating region is electrically connected to said initial gate control circuit means third terminating region, and said sixth switching device second terminating region is electrically connected to said initial gate control circuit means third terminating region.

48. The apparatus of claim 44 wherein said third switching device second terminating region is electrically connected to said initial gate control circuit means third terminating region, and said fourth switching device second terminating region is electrically connected to said initial gate control circuit means third terminating region.

49. The apparatus of claim 45 wherein said initial control gate control circuit means comprises seventh and eighth switching devices, said seventh switching device first and second terminating regions being electrically connected between said initial gate control circuit means first and third terminating regions, and said eighth switching device first and second terminating regions being electrically connected between said initial gate control circuit means second and third terminating regions, wherein said subsequent gate control circuit means comprises ninth and tenth switching devices, said ninth switching device first and second terminating regions being electrically connected between said subsequent gate control circuit means first and third terminating regions, and said tenth switching device first and second terminating regions being electrically connected between said subsequent gate control circuit means second and third terminating regions, and wherein said sequel gate control circuit means comprises eleventh and twelfth switching devices, said eleventh switching device first and second terminating regions being electrically connected between said sequel gate control circuit means first and third terminating regions, and said twelfth switching device first and second terminating regions being electrically connected between said sequel gate control circuit means second and third terminating regions, where each of said seventh switching device control region and said eighth switching device control region is a signal input for said initial logic gate, where each of said ninth switching device control region and said tenth switching device control region is a signal input for said subsequent logic gate, and where each of said eleventh switching device control region and said twelfth switching device control region is a signal input for said sequel logic gate.

50. The apparatus of claim 49 wherein said seventh switching device second terminating region is electrically connected to said initial gate control circuit means third terminating region, and said eighth switching device second terminating region is electrically connected to said initial gate control circuit means third terminating region.

51. A logic gate arrangement for purposes of maintaining proper operation if subjected to ionizing radiation comprising: an initial logic gate comprising:
an initial gate plural state circuit means having a plurality of terminating regions, including initial gate plural state circuit means first and second terminating regions at each of which a plurality of voltage value states can be caused to alternatively occur, if said initial gate plural state circuit means is electrically energized, by establishing at least temporarily a low impedance circuit path from a selected one of said initial plural state circuit means first and second terminating regions to a selected terminating region suited for electrical connection to a selected voltage supply, but with each of said initial gate plural state circuit means first and second terminating regions being in voltage value states different from one another if free of other kinds of voltage value disturbances sufficient to cause a voltage state change, and said initial gate plural state circuit means having a third terminating region suited for electrical connection to a first voltage supply means; and an initial gate control circuit means having a plurality of input regions serving as signal inputs for said initial logic gate, and having a plurality of terminating regions including first, second and third terminating regions, said initial gate control circuit means first terminating region being electrically connected to said initial gate plural state circuit means first terminating region which together serve as a signal output for said initial logic gate, said initial gate control circuit means second terminating region being electrically connected to said initial gate plural state circuit means second terminating region which together serve as a logic output for said initial logic gate, and said initial gate control circuit means third terminating region being suited for electrical connection to a second voltage supply means, and further comprising first and second switching devices, where a switching device is a device having first and second terminating regions and a control region therein by which such switching device is capable of being directed to effectively provide a conductive path of a selected conductivity between its first and second terminating regions, said first switching device first terminating region being electrically connected to said initial gate control circuit means first terminating region, and said second switching device first terminating region being electrically connected to said initial gate control circuit means second terminating region, with each of said first switching device control region and said second switching device control region being a signal input for said initial logic gate, and further comprising third, fourth, fifth and sixth switching devices, said third switching device first terminating region being electrically connected to said initial gate control circuit means first terminating region, said fourth switching device first terminating region being electrically connected to said initial gate control circuit means second terminating region, said fifth switching device first terminating region being electrically connected to both said first switching device and said second switching device second terminating regions, said fifth switching device second terminating region being electrically connected to said initial gate control circuit means third terminating region, said sixth switching device first terminating region being electrically connected to both said third and fourth switching device second terminating regions, said sixth switching device second terminating region being electrically connected to said initial gate control circuit means third terminating region, with each of said third switching device control region, said fourth switching device control region, said fifth switching device control control region and said sixth switching device control region being a signal input for said initial logic gate; and a subsequent logic gate comprising at least one input region, at least one output region and a plurality of terminating regions at least two of which are suited for electrical connection to selected voltage supply means, said subsequent logic gate, if electrically energized, being capable of changing between those voltage value states which can occur on said subsequent logic gate output in response to one or more input voltage value signals received at selected ones of said subsequent logic gate input regions which signals are of a value that equals or goes beyond that threshold voltage value for each of said selected input regions necessary to give effect to such input voltage value signal in causing said changing between voltage value states on said subsequent logic gate output, said subsequent logic gate having at least a selected one of said initial logic gate outputs electrically connected to at least one selected said subsequent logic gate input region, and with said initial gate control circuit means having any low impedance circuit path, established therein between (a) a selected one of said initial gate control circuit first and second terminating regions and (b) said initial gate control circuit third terminating region, being of a sufficiently low impedance so that any circuit current that can be supplied therealong through said initial gate plural state circuit means in any state thereof will cause a voltage drop across such circuit path that is smaller in absolute value than that of said threshold voltage value associated with that said subsequent logic gate input region that is electrically connected, as aforesaid, to said initial logic gate output.

52. A logic gate arrangement for purposes of maintaining proper operation if subjected to ionizing radiation comprising: an initial logic gate comprising:

an initial gate plural state circuit means having a plurality of terminating regions, including plural state circuit means first, second, third and fourth terminating regions, said plural state circuit means comprising first and second p-channel insulated gate field-effect transistors each having a source electrically connected to said plural state circuit means third terminating region, said first transistor having its collector electrically connected to a gate of said second transistor to form said plural state circuit means first terminating region, and said second transistor having its collector electrically connected with a gate of said first transistor to form said plural state circuit means second terminating region, said plural state circuit means first and second terminating regions each being electrically connected by a load means to said plural state means fourth terminating region, said plural state circuit means said third terminating region suited for electrical connection to a first voltage supply means of a relatively positive voltage, and said fourth terminating region suited for electrical connection to a supply of relatively negative voltage; and an initial gate control circuit means having a plurality of input regions serving as signal inputs for said initial logic gate, and having a plurality of terminating regions including first, second and third terminating regions, said initial gate control circuit means first terminating region being electrically connected to said initial gate plural state circuit means first terminating region which together serve as a signal output for said initial logic gate, said initial gate control circuit means second terminating region being electrically connected to said initial gate plural state circuit means second terminating region which together serve as a signal output for said initial logic gate, and said initial gate control circuit means third terminating region being suited for electrical connection to a second voltage supply means, said initial gate control circuit means, if electrically energized, being capable of receiving electrical signals at said initial gate control circuit input regions and, in response, of (i) establishing at least one low impedance circuit path between (a) a selected one of said initial gate control circuit means first and second terminating regions, and (b) said initial gate control circuit means third terminating region, and (ii) establishing only relatively high impedance circuit paths between that remaining initial gate control circuit means terminating region and said initial gate control circuit means third terminating region; and a subsequent logic gate comprising at least one input region, at least one output region and a plurality of terminating regions at least two of which are suited for electrical connection to selected voltage supply means, said subsequent logic gate, if electrically energized, being capable of changing between those voltage value states which can occur on said subsequent logic gate output in response to one or more input voltage value signals received at selected ones of said subsequent logic gate input regions which signals are of a value that equals or goes beyond that threshold voltage value for each of said selected input regions necessary to give effect to such input voltage value signal in causing said changing between voltage value states on said subsequent logic gate output, said subsequent logic gate having at least a selected one of said initial logic gate outputs electrically connected to at least one selected said subsequent logic gate input region, and with said initial gate control circuit means having any said low impedance circuit path established therein as aforesaid being of a sufficiently low impedance so that any circuit current that can be supplied therealong through said initial gate plural state circuit means in one state thereof will cause a voltage drop across such circuit path that is smaller in absolute value than that of said threshold voltage value associated with that said subsequent logic gate input region that is electrically connected, as aforesaid, to said initial logic gate output.

53. A logic gate arrangement for purposes of maintaining proper operation if subjected to iionizing radiation comprising: an initial logic gate comprising;
a plural state circuit means having a plurality of terminating regions, including plural state circuit means first, second, third and fourth terminating regions, said plural state circuit means comprising first and second n-channel insulated gate field-effect transistors each having a source electrically connected to said plural state circuit means third terminating region, said first transistor having its collector electrically connected to a gate of said second transistor to form said plural state circuit means first terminating region, and said second transistor having its collector electrically connected with a gate of said first transistor to form said plural state circuit means second terminating region, said plural state circuit means first and second terminating regions each being electrically connected by a load means to said plural state means fourth terminating region, said plural state circuit means said third terminating region suited for electrical connection to a first voltage supply means of a relatively negative voltage, and said fourth terminating region suited for electrical connection to a supply of relatively positive voltage; and an initial gate control circuit means having a plurality of input regions serving as signal inputs for said initial logic gate, and having a plurality of terminating regions including first, second and third terminating regions, said initial gate control circuit means first terminating region being electrically connected to said initial gate plural state circuit means first terminating region which together serve as a signal output for said initial logic gate, said initial gate control circuit means second terminating region being electrically connected to said initial gate plural state circuit means second terminating region which together serve as a signal output for said initial logic gate, and said initial gate control circuit means third terminating region being suited for electrical connection to a second voltage supply means, said initial gate control circuit means, if electrically energized, being capable of receiving electrical signals at said initial gate control circuit input regions and, in response, of (i) establishing at least one low impedance circuit path between (a) a selected one of said initial gate control circuit means first and second terminating regions, and (b) said initial gate control circuit means third terminating region, and (ii) establishing only relatively high impedance circuit paths between that remaining initial gate control circuit means terminating region and said initial gate control circuit means third terminating region; and a subsequent logic gate comprising at least one input region, at least one output region and a plurality of terminating regions at least two of which are suited for electrical connection to selected voltage supply means, said subsequent logic gate, if electrically energized, being capable of changing between those voltage value states which can occur on said subsequent logic gate output in response to one or more input voltage value signals received at selected ones of said subsequent logic gate input regions which signals are of a value that equals or goes beyond that threshold voltage value for each of said selected input regions necessary to give effect to such input voltage value signal in causing said changing between voltage value states on said subsequent logic gate output, said subsequent logic gate having at least a selected one of said initial logic gate outputs electrically connected to at least one selected said subsequent logic gate input region, and with said initial gate control circuit means having any said low impedance circuit path established therein as aforesaid being of a sufficiently low impedance so that any circuit current that can be supplied therealong through said initial gate plural state circuit means in one state thereof will cause a voltage drop across such circuit path that is smaller in absolute value than that of said threshold voltage value associated with that said subsequent logic gate input region that is electrically connected, as aforesaid, to said initial logic gate output.

54. A logic gate arrangement for purposes of maintaining proper operation if subjected to ionizing radiation comprising: an initial logic gate comprising:

an initial gate plural state circuit means having a plurality of terminating regions, including initial gate plural state circuit means first, second and third terminating regions, said plural state circuit means comprising first and second switching devices, where a switching device is a device having first and second terminating regions and a control region therein by which such switching device is capable of being directed to effectively provide a conductive path of a selected conductivity between its first and second terminating regions, said first and second switching devices first terminating regions each being electrically connected together to form said initial gate plural state circuit means third terminating region, said first switching device second terminating region being electrically connected with said second switching device control region to form said initial gate plural state circuit means first terminating region, and said second switching device second terminating region being electrically connected with said first switching device control region to form said initial plural state circuit means second terminating region, said initial gate plural state circuit means having said third terminating region suited for electrical connection to a first voltage supply means; and an initial gate control circuit means having a plurality of input regions serving as signal inputs for said initial logic gate, and having a plurality of terminating regions including first, second and third terminating regions, said initial gate control circuit means first terminating region being electrically connected to said initial gate plural state circuit means first terminating region which together serve as a signal output for said initial logic gate, said initial gate control circuit means second terminating region being electrically connected to said initial gate plural state circuit means second terminating region which together serve as a logic output for said initial logic gate, and said initial gate control circuit means third terminating region being suited for electrical connection to a second voltage supply means, and further comprising third and fourth switching devices, said third switching device first terminating region being electrically connected to said initial gate control circuit means first terminating region, and said fourth switching device first terminating region being electrically connected to said initial gate control circuit means second terminating region, with each of said third switching device control region and said fourth switching device control region being a signal input for said initial logic gate, and further comprising fifth, sixth, seventh and eighth switching devices, said fifth switching device first terminating region being electrically connected to said initial gate control circuit means first terminating region, said sixth switching device first terminating region being electrically connected to said initial gate control circuit means second terminating region, said seventh switching device first terminating region being electrically connected to both said first switching device and said second switching device second terminating regions, said seventh switching device second terminating region being electrically connected to said initial gate control circuit means third terminating region, said eighth switching device first terminating region being electrically connected to both said fifth and sixth switching device second terminating regions, said eighth switching device second terminating region being electrically connected to said initial gate control circuit means third terminating region, with each of said fifth switching device control region, said sixth switching device control region, said seventh switching device control control region and said eighth switching device control region being a signal input for said initial logic gate; and a subsequent logic gate comprising at least one input region, at least one output region and a plurality of terminating regions at least two of which are suited for electrical connection to selected voltage supply means, said subsequent logic gate, if electrically energized, being capable of changing between those voltage value states which can occur on said subsequent logic gate output in response to one or more input voltage value signals received at selected ones of said subsequent logic gate input regions which signals are of a value that equals or goes beyond that threshold voltage value for each of said selected input regions necessary to give effect to such input voltage value signal in causing said changing between voltage value states on said subsequent logic gate output, said subsequent logic gate having at least a selected one of said initial logic gate outputs electrically connected to at least one selected said subsequent logic gate input region, and with said initial gate control circuit means having any low impedance circuit path, established therein between (a) a selected one of said initial gate control circuit means first and second terminating regions and (b) said initial gate control circuit means third terminating region, being of a sufficiently low impedance so that any circuit current that can be supplied therealong through said initial gate plural state circuit means in any state thereof will cause a voltage drop across such circuit path that is smaller in absolute value than that of said threshold voltage value associated with that said subsequent logic gate input region that is electrically connected, as aforesaid, to said initial logic gate output.

55. A logic gate arrangement for purposes of maintaining proper operation if subjected to ionizing radiation comprising: an initial logic gate comprising:

an initial gate plural state circuit means having a plurality of terminating regions, including initial gate plural state circuit means first, second and third terminating regions, said plural state circuit means comprising first and second switching devices, where a switching device is a device having first and second terminating regions and a control region therein by which such switching device is capable of being directed to effectively provide a conductive path of a selected conductivity between its first and second terminating regions, said first and second switching devices first terminating regions each being electrically connected together to form said initial gate plural state circuit means third terminating region, said first switching device second terminating region being electrically connected with said second switching device control region to form said initial gate plural state circuit means first terminating region, and said second switching device second terminating region being electrically connected with said first switching device control region to form said initial plural state circuit means second terminating region, said initial gate plural state circuit means having said third terminating region suited for electrical connection to a first voltage supply means; and an initial gate control circuit means having a plurality of input regions serving as signal inputs for said initial logic gate, and having a plurality of terminating regions including first, second and third terminating regions, said initial gate control circuit means first terminating region being electrically connected to said initial gate plural state circuit means first terminating region which together serve as a signal output for said initial logic gate, said initial gate control circuit means second terminating region being electrically connected to said initial gate plural state circuit means second terminating region which together serve as a logic output for said initial logic gate, and said initial gate control circuit means third terminating region being suited for electrical connection to a second voltage supply means, and further comprising third and fourth switching devices, said third switching device first terminating region being electrically connected to said initial gate control circuit means first terminating region, and said fourth switching device first terminating region being electrically connected to said initial gate control circuit means second terminating region, with each of said third switching device control region and said fourth switching device control region being a signal input for said initial logic gate, and further comprising fifth, sixth, seventh and eighth switching devices, said fifth switching device first terminating region being electrically connected to said initial gate control circuit means first terminating region, said sixth switching device first terminating region being electrically connected to said initial gate control circuit means second terminating region, said seventh switching device first terminating region being electrically connected to both said first switching device and said second switching device second terminating regions, said seventh switching device second terminating region being electrically connected to said initial gate control circuit means third terminating region, said eighth switching device first terminating region being electrically connected to both said fifth and sixth switching device second terminating regions, said eighth switching device second terminating region being electrically connected to said initial gate control circuit means third terminating region, with each of said fifth switching device control region, said sixth switching device control region, said seventh switching device control control region and said eighth switching device control region being a signal input for said initial logic gate; and a subsequent logic gate comprising at least one input region, at least one output region and a plurality of terminating regions at least two of which are suited for electrical connection to selected voltage supply means, said subsequent logic gate, if electrically energized, being capable of changing between those voltage value states which can occur on said subsequent logic gate output in response to one or more input voltage value signals received at selected ones of said subsequent logic gate input regions which signals are of a value that equals or goes beyond that threshold voltage value for each of said selected input regions necessary to give effect to such input voltage value signal in causing said changing between voltage value states on said subsequent logic gate output, said subsequent logic gate having at least a selected one of said initial logic gate outputs electrically connected to at least one selected said subsequent logic gate input region and having at least a selected one of said initial logic gate input regions electrically connected to at least one selected said subsequent logic gate output, and with said initial gate control circuit means having any low impedance circuit path, established therein between (a) a selected one of said initial gate control circuit means first and second terminating regions and (b) said initial gate control circuit means third terminating region, being of a sufficiently low impedance so that any circuit current that can be supplied therealong through said initial gate plural state circuit means in any state thereof will cause a voltage drop across such circuit path that is smaller in absolute value than that of said threshold voltage value associated with that said subsequent logic gate input region that is electrically connected, as aforesaid, to said initial logic gate output.

56. A logic gate arrangement for purposes of maintaining proper operation if subjected to ionizing radiation comprising: an initial logic gate comprising:

an initial gate plural state circuit means having a plurality of terminating regions, including initial gate plural state circuit means first, second and third terminating regions, said plural state circuit means comprising first and second switching devices, where a switching device is a device having first and second terminating regions and a control region therein by which such switching device is capable of being directed to effectively provide a conductive path of a selected conductivity between its first and second terminating regions, said first and second switching devices first terminating regions each being electrically connected together to form said initial gate plural state circuit means third terminating region, said first switching device second terminating region being electrically connected with said second switching device control region to form said initial gate plural state circuit means first terminating region, and said second switching device second terminating region being electrically connected with said first switching device control region to form said initial plural state circuit means second terminating region, said initial gate plural state circuit means having said third terminating region suited for electrical connection to a first voltage supply means; and an initial gate control circuit means having a plurality of input regions serving as signal inputs for said initial logic gate, and having a plurality of terminating regions including first, second and third terminating regions, said initial gate control circuit means first terminating region being electrically connected to said initial gate plural state circuit means first terminating region which together serve as a signal output for said initial logic gate, said initial gate control circuit means second terminating region being electrically connected to said initial gate plural state circuit means second terminating region which together serve as a signal output for said initial logic gate, and said initial gate control circuit means third terminating region being adapted for electrical connection to a second voltage supply means, said initial gate control circuit means further comprising third, fourth, fifth, sixth, seventh, and eighth switching devices, said third switching device first terminating region being electrically connected to said initial gate control circuit means first terminating region, and said fourth switching device first terminating region being electrically connected to said initial gate control circuit means second terminating region, said fifth switching device first terminating region being electrically connected to said initial gate control circuit means first terminating region, said sixth switching device first terminating region being electrically connected to said initial gate control circuit means second terminating region, said seventh switching device first terminating region being electrically connected to both said third switching device and said fifth switching device second terminating regions, said seventh switching device second terminating region being electrically connected to said initial gate control circuit means third terminating region, said eighth switching device first terminating region being electrically connected to both said fourth and said sixth switching device second terminating regions, said eighth switching device second terminating region being electrically connected to said initial gate control circuit means third terminating region, where each of said third switching device control region, said fourth switching device control region, said fifth switching device control region, said sixth switching device control region, said seventh switching device control region, and said eighth switching device control region is a signal input for said initial logic gate; and a subsequent logic gate comprising:
a subsequent gate plural state circuit means having a plurality of terminating regions, including subsequent gate plural state circuit means first, second and third terminating regions, said subsequent gate plural state circuit means further comprising ninth and tenth switching devices, said ninth and tenth switching devices first terminating regions each being electrically connected together to form said subsequent gate plural state circuit means third terminating region, said ninth switching device means second terminating region being electrically connected with said tenth switching device control region to form said subsequent gate plural state circuit means first terminating region, and said tenth switching device second terminating region being electrically connected with said ninth switching device control region to form said subsequent gate plural state circuit means second terminating region, said subsequent plural state circuit means having said third terminating region suited for electrical connection to a third voltage supply means; and a subsequent gate control circuit means having a plurality of input regions serving as signal inputs for said subsequent logic gate, and having a plurality of terminating regions including first, second and third terminating regions, said subsequent gate control circuit means first terminating region being electrically connected to said subsequent gate plural state circuit means first terminating region which together serve as a signal output for said subsequent logic gate, said subsequent gate control circuit means second terminating region being electrically connected to said subsequent gate plural state circuit means second terminating region which together serve as a signal output for said subsequent logic gate, said subsequent gate control circuit means third terminating region being suited for electrical connection to a fourth voltage supply means, said subsequent logic gate having at least a selected one of said initial logic gate outputs electrically connected to at least one selected said subsequent logic gate input region, and with said initial gate control circuit means having any said low impedance circuit path established therein between (a) a selected one of said initial gate control circuit means first and second terminating regions and (b) said initial gate control circuit means third terminating region, being of sufficiently low impedance so that any circuit current that can be supplied therealong through said initial gate plural state circuit means in any state thereof will cause a voltage drop across said circuit path that is smaller in absolute value than that of a threshold voltage value of that subsequent logic gate input region beyond which values of signals at that initial logic gate output must go to be able to cause voltage value state changes on said subsequent logic gate outputs, said subsequent gate control circuit means comprising eleventh and twelfth switching devices, said eleventh switching device first and second terminating regions being electrically connected between said subsequent gate control circuit means first and third terminating regions, and said twelfth switching device first and second terminating regions being electrically connected between said subsequent gate control circuit means second and third terminating regions, where each of said eleventh switching device control region and said twelfth switching device control region is a signal input for said subsequent logic gate.

57. A logic gate arrangement for purposes of maintaining proper operation if subjected to ionizing radiation comprising: an initial logic gate comprising:
an initial gate plural state circuit means having a plurality of terminating regions, including initial gate plural state circuit means first, second and third terminating regions, said plural state circuit means comprising first and second switching devices, where a switching device is a device having first and second terminating regions and a control region therein by which such switching device is capable of being directed to effectively provide a conductive path of a selected conductivity between its first and second terminating regions, said first and second switching devices first terminating regions each being electrically connected together to form said initial gate plural state circuit means third terminating region, said first switching device second terminating region being electrically connected with said second switching device control region to form said initial gate plural state circuit means first terminating region, and said second switching device second terminating region being electrically connected with said first switching device control region to form said initial plural state circuit means second terminating region, said initial gate plural state circuit means having said third terminating region suited for electrical connection to a first voltage supply means; and an initial gate control circuit means having a plurality of input regions serving as signal inputs for said initial logic gate, and having a plurality of terminating regions including first, second and third terminating regions, said initial gate control circuit means first terminating region being electrically connected to said initial gate plural state circuit means first terminating region which together serve as a signal output for said initial logic gate, said initial gate control circuit means second terminating region being electrically connected to said initial gate plural state circuit means second terminating region which together serve as a signal output for said initial logic gate, and said initial gate control circuit means third terminating region being suited for electrical connection to a second voltage supply means, said initial gate control circuit means further comprising third, fourth, fifth, sixth, seventh, and eighth switching devices, said third switching device first terminating region being electrically connected to said initial gate control circuit means first terminating region, and said fourth switching device first terminating region being electrically connected to said initial gate control circuit means second terminating region, said fifth switching device first terminating region being electrically connected to said initial gate control circuit means first terminating region, said sixth switching device first terminating region being electrically connected to said initial gate control circuit means second terminating region, said seventh switching device first terminating region being electrically connected to both said third switching device and said fifth switching device second terminating regions, said seventh switching device second terminating region being electrically connected to said initial gate control circuit means third terminating region, said eighth switching device first terminating region being electrically connected to both said fourth and said sixth switching device second terminating regions, said eighth switching device second terminating region being electrically connected to said initial gate control circuit means third terminating region, where each of said third switching device control region, said fourth switching device control region, said fifth switching device control region, said sixth switching device control region, said seventh switching device control region, and said eighth switching device control region is a signal input for said initial logic gate; and a subsequent logic gate comprising:

a subsequent gate plural state circuit means having a plurality of terminating regions, including subsequent gate plural state circuit means first and second terminating regions at each of which a plurality of voltage value states can be caused to alternately occur, if said subsequent plural state circuit means is electrically energized, by establishing at least temporarily a low impedance circuit path from a selected one of said subsequent gate plural state circuit means first and second terminating regions to a selected terminating region suited for electrical connection to a selected voltage supply, but with each of said subsequent gate plural state circuit means first and second terminating regions being in voltage value states different from one another if free of other kinds of other voltage value disturbances sufficient to cause a voltage value state change, and said subsequent plural state circuit means having a third terminating region suited for electrical connection to a third voltage supply means; and a subsequent gate control circuit means having a plurality of input regions serving as signal inputs for said subsequent logic gate, and having a plurality of terminating regions including first, second and third terminating regions, said subsequent gate control circuit means first terminating region being electrically connected to said subsequent plural state circuit means first terminating region which together serve as a signal output for said subsequent logic gate, said subsequent gate control circuit means second terminating region being electrically connected to said subsequent gate plural state circuit means second terminating region which together serve as a signal output for said subsequent logic gate, and said subsequent gate control circuit means third terminating region being suited for electrical connection to a fourth voltage supply means, said subsequent logic gate having at least a selected one of said initial logic gate outputs electrically connected to at least one selected said subsequent logic gate input region, said subsequent gate control circuit means, if electrically energized, being capable of receiving electrical signals at said subsequent gate control circuit input regions and, in response, of (i) establishing at least one low impedance circuit path between (a) a selected one of said subsequent gate control circuit means first and second terminating regions, and (b) said subsequent gate control circuit means third terminating region, and (ii) establishing only relatively high impedance circuit paths between that remaining subsequent gate control circuit means terminating region and said subsequent gate control circuit means third terminating region; and a sequel logic gate comprising at least one input region, at least one output region and a plurality of terminating regions at least two of which are suited for electrical connection to selected voltage supply means, said sequel logic gate, if electrically energized, being capable of changing between those voltage values which can occur on said sequel logic gate output in response to one or more input voltage values received at selected ones of said sequel logic gate input regions which signals are of a value that equals or goes beyond that threshold voltage value for each of said selected input regions necessary to give effect to such input voltage value signal in causing said changing between voltage value states on said sequel logic gate output, said sequel logic gate having at least a selected one of said subsequent logic gate outputs electrically connected to at least one selected said sequel logic gate input region, and with said subsequent gate control circuit means having any said low impedance path established therein as aforesaid being of a sufficiently low impedance so that any circuit current that can be supplied there along by said subsequent gate plural state circuit means in any state thereof will cause a voltage drop across such circuit path that is smaller in absolute value than that of said threshold voltage value associated with that said sequel logic gate input region that is electrically connected, as aforesaid, to said subsequent logic gate output, said sequel logic gate having a selected one of its outputs electrically connected to a selected one of said initial logic gate inputs.

58. A logic gate arrangement for purposes of maintaining proper operation if subjected to ionizing radiation comprising: an initial logic gate comprising:

an initial gate plural state circuit means having a plurality of terminating regions, including initial gate plural state circuit means first, second and third terminating regions, said plural state circuit means comprising first and second switching devices where a switching device is a device having first and second terminating regions and a control region therein by which such switching device is capable of being directed to effectively provide a conductive path of a selected conductivity between its first and second terminating regions, said first and second switching devices first terminating regions each being electrically connected together to form said initial gate plural state circuit means third terminating region, said first switching device second terminating region being electrically connected with said second switching device control region to form said initial gate plural state circuit means first terminating region, and said second switching device second terminating region being electrically connected with said first switching device control region to form said initial plural state circuit means second terminating region, said initial gate plural state circuit means having said third terminating region suited for electrical connection to a first voltage supply means; and an initial gate control circuit means having a plurality of input regions serving as signal inputs for said initial logic gate, and having a plurality of terminating regions including first, second and third terminating regions, said initial gate control circuit means first terminating region being electrically connected to said initial gate plural state circuit means first terminating region which together serve as a signal output for said initial logic gate, said initial gate control circuit means second terminating region being electrically connected to said initial gate plural state circuit means second terminating region which together serve as a signal output for said initial logic gate, and said initial gate control circuit means third terminating region being suited for electrical connection to a second voltage supply means, said initial gate control circuit means further comprising third, fourth, fifth, sixth, seventh, and eighth switching devices, said third switching device first terminating region being electrically connected to said initial gate control circuit means first terminating region, and said fourth switching device first terminating region being electrically connected to said initial gate control circuit means second terminating region, said fifth switching device first terminating region being electrically connected to said initial gate control circuit means first terminating region, said sixth switching device first terminating region being electrically connected to said initial gate control circuit means second terminating region, said seventh switching device first terminating region being electrically connected to both said third switching device and said fifth switching device second terminating regions, said seventh switching device second terminating region being electrically connected to said initial gate control circuit means third terminating region, said eighth switching device first terminating region being electrically connected to both said fourth and said sixth switching device second terminating regions, said eight switching device second terminating region being electrically connected to said initial gate control circuit means third terminating region, where each of said third switching device control region, said fourth switching device control region, said fifth switching device control region, said sixth switching device control region, said seventh switching device control region, and said eighth switching device control region is a signal input for said initial logic gate; and a subsequent logic gate comprising:
a subsequent gate plural state circuit means having a plurality of terminating regions, including subsequent gate plural state circuit means first, second and third terminating regions, said subsequent gate plural state circuit means further comprising ninth and tenth switching devices, said ninth and tenth switching devices first terminating regions each being electrically connected together to form said subsequent gate plural state circuit means third terminating region, said ninth switching device means second terminating region being electrically connected with said tenth switching device control region to form said subsequent gate plural state circuit means first terminating region, and said tenth switching device second terminating region being electrically connected with said ninth switching device control region to form said subsequent gate plural state circuit means second terminating region, said subsequent plural-state circuit means having said third terminating region suited for electrical connection to a third voltage supply means; and a subsequent gate control circuit means having a plurality of input regions serving as signal inputs for said subsequent logic gate, and having a plurality of terminating regions including first, second and third terminating regions, said subsequent gate control circuit means first terminating region being electrically connected to said subsequent gate plural state circuit means first terminating region which together serve as a signal output for said subsequent logic gate, said subsequent gate control circuit means second terminating region being electrically connected to said subsequent gate plural state circuit means second terminating region which together serve as a signal output for said subsequent logic gate, said subsequent gate control circuit means third terminating region being suited for electrical connection to a fourth voltage supply means, said subsequent logic gate having at least a selected one of said initial logic gate outputs electrically connected to at least one selected said subsequent logic gate input region, and with said initial gate control circuit means having any said low impedance circuit path, established therein between (a) a selected one of said initial gate control circuit means first and second terminating regions and (b) said initial gate control circuit means third terminating region, being of sufficiently low impedance so that any circuit current that can be supplied therealong through said initial gate plural state circuit means in any state thereof will cause a voltage drop across said circuit path that is smaller in absolute value than that of a threshold voltage value of that subsequent logic gate input region beyond which values of signals at that initial logic gate output must go to be able to cause voltage value state changes on said subsequent logic gate outputs, said subsequent gate control circuit means comprising eleventh and twelfth switching devices, said eleventh switching device first and second terminating regions being electrically connected between said subsequent gate control circuit means first and third terminating regions, and said twelfth switching device first and second terminating regions being electrically connected between said subsequent gate control circuit means second and third terminating regions, where each of said eleventh switching device control region and said twelfth switching device control region is a signal input for said subsequent logic gate; and a sequel logic gate comprising:
  a sequel gate plural state circuit means having a plurality of terminating regions, including sequel gate plural state circuit means first, second and third terminating regions, said sequel gate plural state circuit means further comprising thirteenth and fourteenth switching devices, said thirteenth and fourteenth switching devices first terminating regions each being electrically connected together to form said sequel gate plural state circuit means third terminating region, said thirteenth switching device means second terminating region being electrically connected with said fourteenth switching device control region to form said sequel gate plural state circuit means first terminating region, and said fourteenth switching device second terminating region being electrically connected with said thirteenth switching device control region to form said sequel gate plural state circuit means second terminating region, said sequel plural state circuit means having said third terminating region suited for electrical connection to a third voltage supply means; and a sequel gate control circuit means having a plurality of input regions serving as signal inputs for said sequel logic gate, and having a plurality of terminating regions including first, second and third terminating regions, said sequel gate control circuit means first terminating region being electrically connected to said sequel gate plural state circuit means first terminating region which together serve as a signal output for said sequel logic gate, said sequel gate control circuit means second terminating region being electrically connected to said sequel gate plural state circuit means second terminating region which together serve as a signal output for said sequel logic gate, said sequel gate control circuit means third terminating region being suited for electrical connection to a sixth voltage supply means, said sequel logic gate having at least a selected one of said subsequent logic gate outputs electrically connected to at least one selected said sequel logic gate input region, and with said subsequent gate control circuit means having any said low impedance circuit path, established therein between (a) a selected one of said subsequent gate control circuit means first and second terminating regions and (b) said subsequent gate control circuit means third terminating region, being of sufficiently low impedance so that any circuit current that can be supplied therealong through said subsequent gate plural state circuit means in any state thereof will cause a voltage drop across said circuit path that is smaller in absolute value than that of a threshold voltage value of that sequel logic gate input region beyond which values of signals at that subsequent logic gate output must go to be able to cause voltage value state changes on said sequel logic gate outputs, said sequel gate control circuit means comprising fifteenth and sixteenth switching devices, said fifteenth switching device first and second terminating regions being electrically connected between said sequel gate control circuit means first and third terminating regions, and said sixteenth switching device first and second terminating regions being electrically connected between said sequel gate control circuit means second and third terminating regions, where each of said fifteenth switching device control region and said sixteenth switching device control region is a signal input for said sequel logic gate.

* * * * *

UNITED STATES PATENT AND TRADEMARK OFFICE
CERTIFICATE OF CORRECTION

PATENT NO. : 4,833,347
DATED : May 23, 1989
INVENTOR(S) : Robert L. Rabe

It is certified that error appears in the above-identified patent and that said Letters Patent is hereby corrected as shown below:

Column 43, line 59, delete "iionizing" and insert therefore --ionizing--.

Column 54, line 30, delete "eight" and insert therefore --eighth--.

Signed and Sealed this

Tenth Day of July, 1990

Attest:

HARRY F. MANBECK, JR.

*Attesting Officer*     *Commissioner of Patents and Trademarks*